US012058461B2

(12) United States Patent
Kim et al.

(10) Patent No.: US 12,058,461 B2
(45) Date of Patent: Aug. 6, 2024

(54) IMAGE SENSOR WITH SELECTIVE PIXEL READOUT, OPERATING METHOD THEREOF, AND ELECTRONIC DEVICE INCLUDING THE SAME

(71) Applicant: SAMSUNG ELECTRONICS CO., LTD., Suwon-si (KR)

(72) Inventors: Jungwoo Kim, Hwaseong-si (KR); Myunghwa Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/850,073

(22) Filed: Jun. 27, 2022

(65) Prior Publication Data

US 2023/0138770 A1  May 4, 2023

(30) Foreign Application Priority Data

Nov. 1, 2021  (KR) .......................... 10-2021-0148265

(51) Int. Cl.
*H04N 25/75* (2023.01)
*H03M 1/12* (2006.01)
*H04N 25/40* (2023.01)
*H04N 25/50* (2023.01)
*H04N 25/709* (2023.01)

(52) U.S. Cl.
CPC .......... *H04N 25/75* (2023.01); *H03M 1/1205* (2013.01); *H04N 25/40* (2023.01); *H04N 25/50* (2023.01); *H04N 25/709* (2023.01)

(58) Field of Classification Search
CPC ........ H04N 25/75; H04N 25/40; H04N 25/50; H04N 25/709; H04N 25/767; H03M 1/1205; H01L 27/14603; H01L 27/14636
See application file for complete search history.

(56) References Cited

U.S. PATENT DOCUMENTS

| 1,087,226 A | 2/1914 | Fahrney |
| 7,106,374 B1 * | 9/2006 | Bandera ............... H04N 23/951 |
| | | 348/308 |
| 10,872,261 B2 | 12/2020 | Nikhara et al. |

(Continued)

FOREIGN PATENT DOCUMENTS

| KR | 10-2004-0053090 A | 6/2004 |
| KR | 10-0615362 B1 | 8/2006 |
| KR | 10-2021-0032722 A | 3/2021 |

*Primary Examiner* — Mekonnen D Dagnew
(74) *Attorney, Agent, or Firm* — Sughrue Mion, PLLC

(57) ABSTRACT

Disclosed are an image sensor, an operating method thereof, and an electronic device including the image sensor. The image sensor includes a pixel array including a plurality of pixels, a first selection/read-out circuit, a second selection/read-out circuit, and a controller provided to select a pixel of the pixel array and control the first and second selection/read-out circuits to read out information of the selected pixel. The first selection/read-out circuit provides a signal for selecting a pixel of the pixel array in a first direction, reads out a plurality of pixel signals received from the pixel array in a direction corresponding to the first direction, and the second selection/read-out circuit provides a signal for selecting a pixel of the pixel array in a second direction, and reads out a plurality of pixel signals received from the pixel array in a direction corresponding to the second direction.

20 Claims, 12 Drawing Sheets

(56) References Cited

U.S. PATENT DOCUMENTS

| | | | |
|---|---|---|---|
| 2006/0008145 A1* | 1/2006 | Kaku | G06V 40/161 |
| | | | 382/173 |
| 2009/0225189 A1* | 9/2009 | Morin | G03B 7/003 |
| | | | 348/222.1 |
| 2010/0141746 A1* | 6/2010 | Ikeda | A61B 5/0084 |
| | | | 348/E7.085 |
| 2011/0157401 A1 | 6/2011 | Qin et al. | |
| 2020/0021765 A1 | 1/2020 | Spagnolo et al. | |
| 2020/0169669 A1* | 5/2020 | Petkov | G06F 1/3265 |
| 2021/0082980 A1 | 3/2021 | Ryu | |

\* cited by examiner

FIG. 3

REGION OF INTEREST

IMAGE SENSOR WITH SELECTIVE PIXEL READOUT, OPERATING METHOD THEREOF, AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2021-0148265, filed on Nov. 1, 2021, in the Korean Intellectual Property Office, the disclosure of which is incorporated by reference herein in its entirety.

BACKGROUND

1. Field

The disclosure relates to an image sensor, operating methods thereof, and an electronic device including the same.

2. Description of the Related Art

An image sensor has a two-dimensional planar structure formed by arraying pixels, which are the smallest units, and receives light in a viewing region by using an optical system to capture an image.

Recently, due to the demand for resolution improvement of the image sensor, the size of image data generated by an image sensor has increased accordingly. However, due to the limitation of physical specifications of an electronic device to which the image sensor is applied, reducing the size of an image sensor module has limitations, and when the resolution of the image sensor is simply increased to realize a high image resolution, a frame rate may be lowered. The simple resolution improvement may increase the amount of information resulting in a load on the read-out circuit and interface speed, which lowers a switching speed of a screen.

The image sensor has a two-dimensional pixel array structure and performs read-out in a row-by-row order. It is impossible to read out only a region of interest of an image, and information on the region of interest may be processed after sequentially reading out all information. Accordingly, when there is information of interest in a specific region in the high-resolution image sensor, the entire information of the image sensor may be read out, and information of the region of interest may be extracted through post-processing.

SUMMARY

Provided are image sensors capable of selectively reading out pixel information, operating methods thereof, and electronic devices including the image sensors.

Additional aspects will be set forth in part in the description which follows and, in part, will be apparent from the description, or may be learned by practice of the presented embodiments of the disclosure.

According to an aspect of the disclosure, there is provided an image sensor including: a pixel array including a plurality of pixels, a first selection/read-out circuit configured to provide a first signal for selecting a pixel of the pixel array in a first direction and read out a plurality of pixel signals received from the pixel array in the first direction, a second selection/read-out circuit configured to provide a second signal for selecting pixels of the pixel array in a second direction and read out a plurality of pixel signals received from the pixel array in the second direction and a controller configured to select the pixel of the pixel array and control the first and second selection/read-out circuits to read out information of the selected pixel, wherein the first direction corresponds to one of a row direction or a column direction of the pixel array and the second direction corresponds to other of the row direction or the column direction of the pixel array.

The image sensor further includes a plurality of first selection lines, each configured to provide a selection signal to a respective pixel of the pixel array in the first direction, and a plurality of first transmission lines, each to read out information of a respective pixel in the first direction; and a plurality of second selection lines, each configured to provide a selection signal to a respective pixel of the pixel array in the second direction, and a plurality of second transmission lines each configured to read out information of a respective pixel in the second direction.

The selected pixel may be electrically connected to at least one selection line, to which a signal is applied, from among the plurality of first selection lines and at least one selection line, to which a signal is applied, from among the plurality of second selection lines, and one of the first selection/read-out circuit or the second selection/read-out circuit is configured to read-out a pixel signal of the selected pixel.

The first selection/read-out circuit may include: a first analog-to-digital converter (ADC) circuit configured to convert a pixel signal received through a first transmission line, among the plurality first transmission lines, into digital data, and wherein the second selection/read-out circuit may include: a second analog-to-digital converter (ADC) circuit configured to convert a pixel signal received through a second transmission line, among the plurality second transmission lines, into digital data.

The controller may be further configured to control the first selection/read-out circuit and the second selection/read-out circuit to extract pixel information radially from a center of a region of interest of the pixel array.

The controller may be further configured to control the first selection/read-out circuit and the second selection/read-out circuit so that a sequence in which the pixels are extracted is in a spiral form.

The region of interest may correspond to a range of pixels including or not including a central region of the pixel array.

The controller may be further configured to control the first selection/read-out circuit and the second selection/read-out circuit to vary a resolution of the pixel array.

The controller may be further configured to control the first selection/read-out circuit and the second selection/read-out circuit to extract pixel information from non-contiguous regions of the pixel array.

The controller may be further configured to select the pixel to extract pixel information at a resolution lower than a basic resolution of the pixel array, and read out a pixel signal from the selected pixel.

The controller may be further configured to control the first selection/read-out circuit and the second selection/read-out circuit to extract pixel information from non-contiguous regions of the pixel array.

According to another aspect of the disclosure, there is provided an electronic device including: an image sensor configured to receive light reflected from an object, the image sensor including: a pixel array including a plurality of pixels, a first selection/read-out circuit configured to provide a signal for selecting a pixel of the pixel array in a first direction and read out a plurality of pixel signals received from the pixel array in the first direction, a second selection/read-out circuit configured to provide a signal for selecting pixels of the pixel array in a second direction and read out a plurality of pixel signals received from the pixel array in the second direction and a controller provided to select the pixel of the pixel array and control the first selection/read-out circuit and the second selection/read-out circuit to read out information of the selected pixel, wherein the first direction corresponds to one of a row direction or a column direction of the pixel array and the second direction corresponds to other of the row direction or the column direction of the pixel array; and a processor configured to process a signal from the image sensor.

According to another aspect of the disclosure, there is provided a method of acquiring an image by using an image sensor, the method comprising: applying a first signal for selecting a pixel of a pixel array in a first direction through at least one among a plurality of first selection lines; and applying a second signal for selecting a pixel of the pixel array in a second direction through at least one among a plurality of second selection lines, selecting at least one pixel of the pixel array electrically connected to at least one first selection line applying the first signal and at least one second selection line applying the second signal, reading out information of the selected at least one pixel, wherein the first direction corresponds to one of a row direction or a column direction of the pixel array and the second direction corresponds to other of the row direction or the column direction of the pixel array.

The reading out may include reading out information of the selected pixel through at least one of a plurality of first transmission lines that are in the first direction and a plurality of second transmission lines that are in the second direction.

The method may further include converting a pixel signal received through a first transmission line, among the plurality of first transmission lines, into digital data; and converting a pixel signal received through the second transmission line, among the plurality of second transmission lines, into digital data.

The method may further include setting a region of interest of the pixel array, wherein selection signals are applied through the first and second selection lines to radially extract pixel information from a center of the region of interest of the pixel array.

The method may further include applying the selection signals through the first and second selection lines so that a sequence in which the pixels are extracted is in a spiral form.

The region of interest may correspond to a range of pixels including or not including a central region of the pixel array.

The method may further include applying the selection signals through the first and second selection lines to extract pixel information from a non-contiguous region of the pixel array at a resolution lower than a basic resolution of the pixel array.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 3 shows an example of extracting pixel signals of pixels in a region of interest (ROI: hatched portion) of a pixel array;

DETAILED DESCRIPTION

Figure 1:
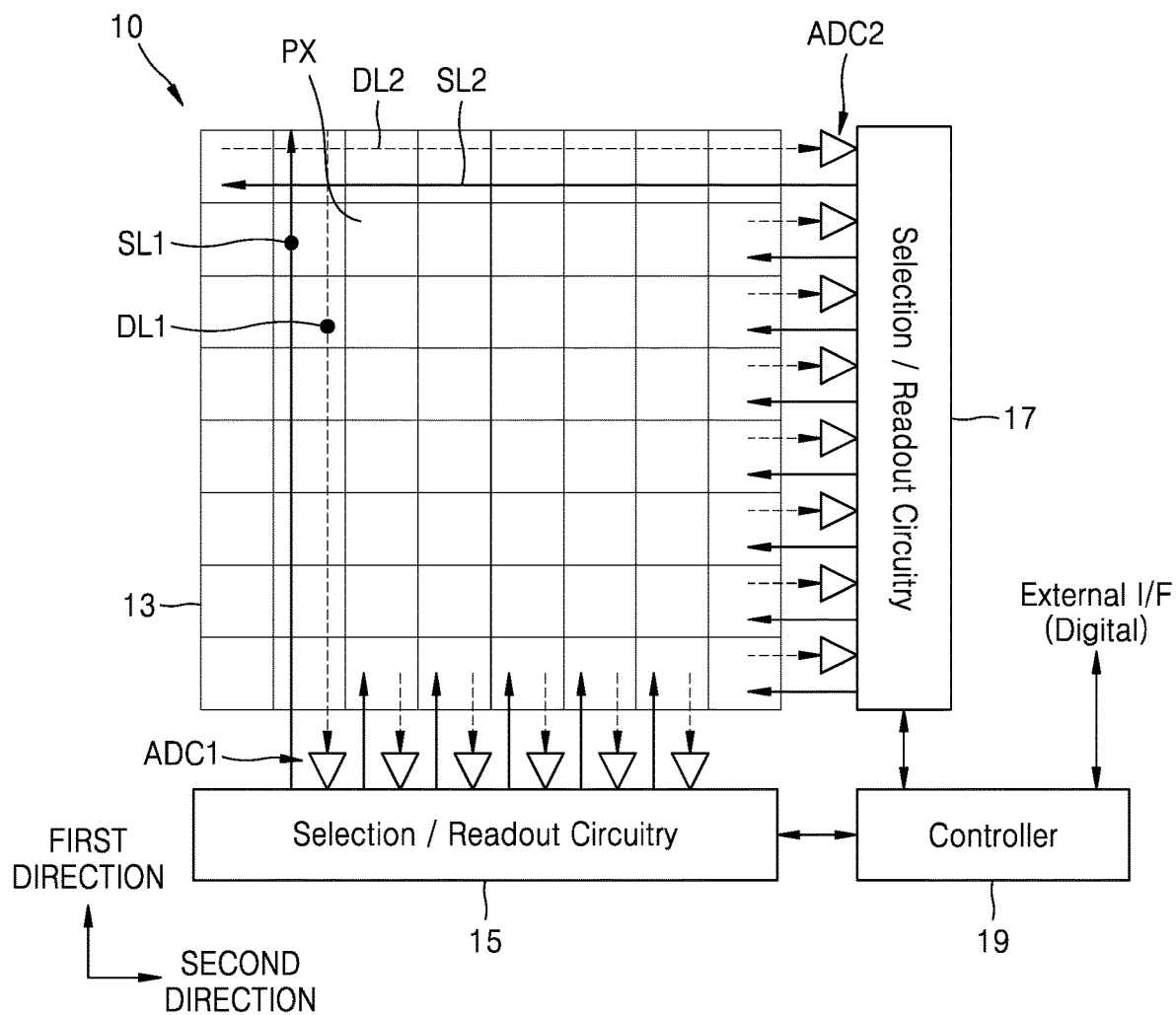
FIG. 1 is a block diagram schematically showing an image sensor according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereafter, the inventive concept will be described more fully with reference to the accompanying drawings. In the drawings, like reference numerals refer to like elements, and the size of each component may be exaggerated for clarity and convenience of explanation. The embodiments of the inventive concept are capable of various modifications and may be embodied in many different forms.

Hereinafter, when an element is described using an expression "above" or "on", the element may include not only the element being immediately on/under/left/right in a contact manner, but also being on/under/left/right in a non-contact manner. Singular expressions include plural expressions unless the context clearly indicates otherwise. Also, when a part "comprises" or "includes" an element in the specification, unless otherwise defined, it is not excluding other elements but may further include other elements.

The use of the term "above" and similar referential terms may be used in both the singular and the plural. With respect to operations that constitute a method, the operations may be performed in any appropriate sequence unless the sequence of operations is clearly described or unless the context clearly indicates otherwise, and the operations may not necessarily be performed in the order of sequence.

Also, in the specification, the term "units" or " . . . modules" denote units or modules that process at least one function or operation, and may be realized by hardware, software, or a combination of hardware and software.

Connections of lines and connection members between constituent elements depicted in the drawings are examples of functional connection and/or physical or circuitry connections, and thus, in practical devices, may be expressed as replicable or additional functional connections, physical connections, or circuit connections.

The use of all examples or example terms is merely for describing the technical scope of the inventive concept in detail, and thus, the scope of the inventive concept is not limited by the examples or the example terms as long as it is not defined by the claims.

Figure 2:
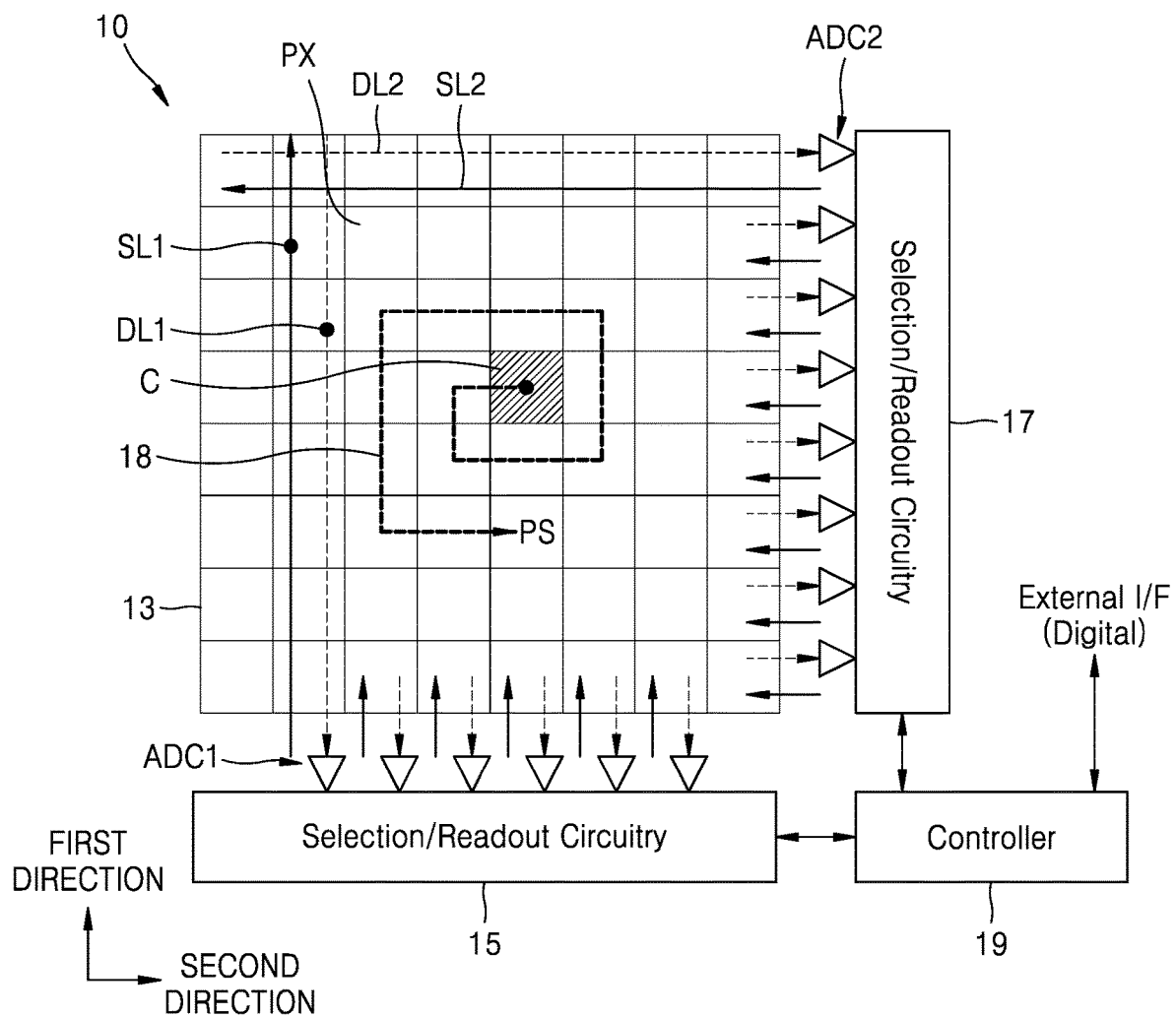
FIG. 2 shows an example of an operation of extracting pixel information from a pixel array of the image sensor of FIG. 1.

FIG. 1 is a block diagram schematically showing an image sensor 10 according to an example embodiment. FIG. 2 shows an example operation of extracting pixel information from a pixel array 13 of the image sensor 10 of FIG. 1. In FIGS. 1 and 2, ADC1 and ADC2 that convert pixel signals transmitted through first and second transmission lines DL1 and DL2, respectively, into digital data are provided at input terminals of first and second selection/read-out circuits 15 and 17. According to an example embodiment, ADC1 and ADC2 are analog-to-digital converter circuits. This is to show a connection relationship between the ADC circuit of the first selection/read-out circuit 15 and the first transmission line DL1 and a connection relationship between the ADC circuit of the second selection/read-out circuit 17 and the second transmission line DL2.

Referring to FIGS. 1 and 2, the image sensor 10 according to an example embodiment may include the pixel array 13, the first and second selection/read-out circuits 15 and 17, and a controller 19. The pixel array 13 includes a plurality of pixels PX. When one of the row and column directions is referred to as a first direction and the remaining direction is referred to as a second direction, the first selection/read-out circuit 15 may be configured to provide a signal for selecting pixels PX of the pixel array 13 in the first direction, for example, the column direction, and to read out a pixel signal received from the selected pixel of the pixel array 13 in the first direction. The second selection/read-out circuit 17 may be configured to provide a signal for selecting the pixel PX of the pixel array 13 in the second direction, for example, the row direction, and to read out a pixel signal received from the selected pixel PX of the pixel array 13 in the second direction. The controller 19 may provide control signals to the selected pixels of the pixel array 13 and control the first and second selection/read-out circuits 15 and 17 to read out information of the selected pixels.

The pixel array 13 may include a plurality of pixels PX that are two-dimensionally arranged in the first direction and the second direction. The pixel array 13 may include an arrangement of a first selection line SL1 and the first transmission line DL1 connected to the plurality of pixels PX in the first direction, and an arrangement of a second selection line SL2 and the second transmission line DL2 connected to the pixels PX in the second direction. In the image sensor 10 according to the example embodiment, the pixel array 13 may be driven to extract pixel information from a continuous region or a non-contiguous region.

Each pixel PX of the pixel array 13 may include a photo-sensing element and a pixel circuit. The photo-sensing element of each pixel PX may sense received light and convert the received light into an electric signal. The pixel circuit of each pixel PX may be driven to read out information of a selected pixel (PX) through the first transmission line DL1 and/or the second transmission line DL2 according to a selection signal input from the first and second selection/read-out circuits 15 and 17 through the first and second selection lines SL1 and SL2.

The pixel circuit may be provided to output a pixel signal of a selected pixel when a selection signal is applied from both the first and second selection/read-out circuits 15 and 17. When a selection signal applied from the first selection/read-out circuit 15 is a first selection signal and a selection signal applied from the second selection/read-out circuit 17 is a second selection signal, the first selection signal and the second selection signal may be the same signal or different signals from each other. The pixel circuit may be provided to output a pixel signal of the selected pixel when the first and second selection signals are applied. When the first selection signal and the second selection signal are different signals, the pixel circuit may be provided to switch an output direction of a pixel signal of the selected pixel according to the first and second selection signals, that is, whether to output to the first selection/read-out circuit 15 or to the second selection/read-out circuit 17. In addition, the pixel circuit may be provided to output the pixel signal of the selected pixel to both the first selection/read-out circuit 15 and the second selection/read-out circuit 17.

In the pixel array 13, for example, pixels PX sensing signals of different colors may be repeatedly arranged in a column direction and a row direction. Here, any one of the column direction and the row direction may correspond to the first direction, and the remaining direction may correspond to the second direction. A photo-sensing element may be provided in each pixel PX to sense light and convert the sensed light into photocharges. The pixel array 13 may include a pixel circuit to acquire a pixel signal that is photoelectrically converted from the photo-sensing element of each pixel PX. The photo-sensing element may include an organic or inorganic material, such as an inorganic photo diode, an organic photo diode, a perovskite photo diode, a photo transistor, a photo gate, or a pinned photo diode, etc.

A micro lens for light collection may be disposed on each of the plurality of pixels PX or on each of pixel groups including adjacent pixels. Each of the plurality of pixels PX may detect light in a specific spectral region from light received through the micro lens.

For example, the pixel array 13 may include a red pixel R for converting red light into an electrical signal, a green pixel G for converting green light into an electrical signal, and a blue pixel B for converting blue light into an electrical signal. A color filter for transmitting light of a specific color may be disposed on each of the plurality of pixels PX. However, the example embodiment is not limited thereto, and the pixel array 13 may include pixels that convert light in a spectral region other than red, green, and blue into an electrical signal. As another example, the plurality of pixels PX may have a multi-layer structure. The pixel of the multi-layered structure may include stacked photo-sensing elements that convert light of different spectral regions into electrical signals, and electrical signals corresponding to light of different colors may be generated from the photo-sensing elements. That is, electrical signals corresponding to light of a plurality of colors may be output from one pixel PX.

Figure 3:
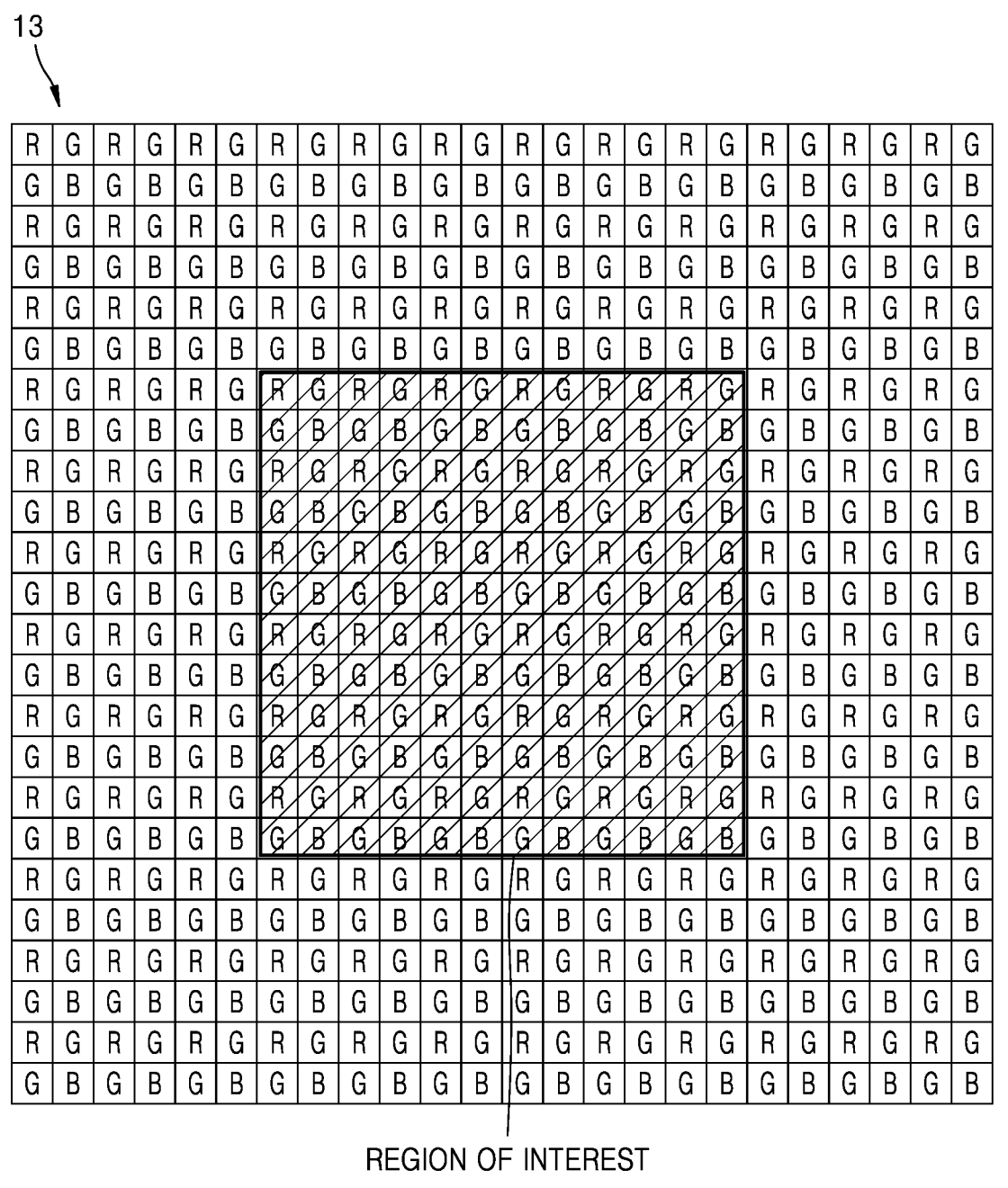
Figure 4:
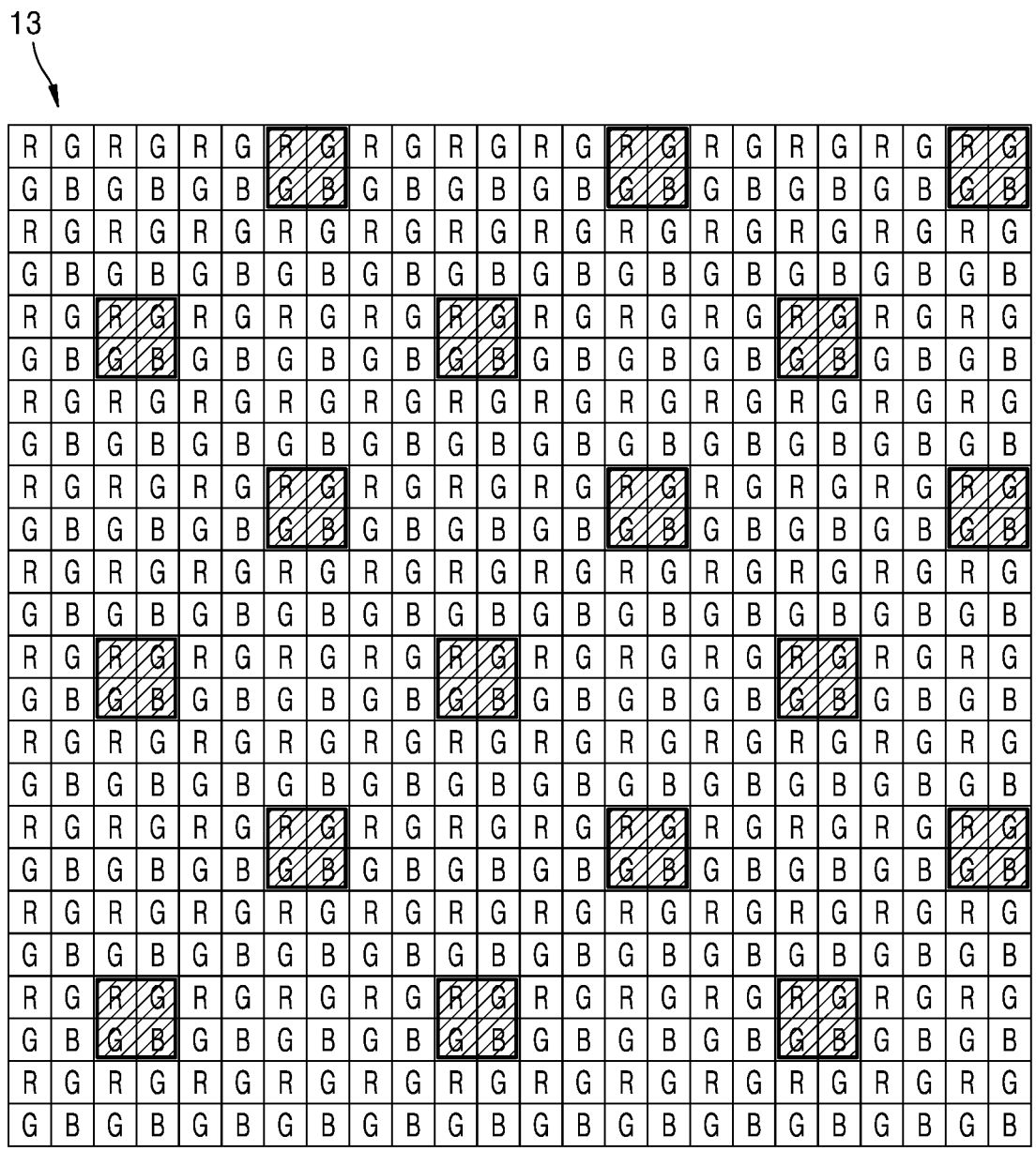
FIG. 4 shows an example of extracting pixel signals of pixels of a plurality of separated regions (hatched regions) of a pixel array.

The pixel array 13 may have various pattern structures in which pixels PX of three or more different colors are repeatedly arranged. For example, the pixel array 13 may have an RGB Bayer pattern structure as shown in FIGS. 3 and 4 as an example. In the pixel array 13, a row in which a red pixel R, a green pixel G, for example, a first green pixel G, are arranged, and a row in which another green pixel G, for example, a second green pixel G and a blue color pixels B are arranged are repeatedly arranged, and the first green pixel G and the second green pixel G may be disposed on a diagonal line. That is, the green pixel G may be arranged in every row, and the red pixel R and the blue pixel B may be alternately arranged in each row. In this way, the pixel array 13 may be arranged so that a unit pixel including two green pixels G, one red pixel R, and one blue pixel B forms a Bayer pattern. FIGS. 3 and 4 show a case in which the pixel array 13 has an RGB Bayer pattern structure, which is an example, and the example embodiment is not limited thereto. Various patterns in which pixels PX of three or more different colors are repeatedly arranged may be applied to the pixel array 13.

The first selection/read-out circuit 15 may provide a signal for selecting a pixel PX of the pixel array 13 through the first selection line SL1 in the first direction, and read out a pixel signal received from the pixel array 13 through the first transmission line DL1 in a direction corresponding to the first direction (the first direction or the opposite direction). The first selection/read-out circuit 15 may be electrically connected to the plurality of first selection lines SL1 for providing a selection signal to the pixel array 13 in the first direction, and to the plurality of first transmission lines DL1 for transmitting a pixel signal of the selected pixel to the first selection/read-out circuit 15 in a direction corresponding to the first direction. The first selection/read-out circuit 15 may include an ADC circuit 21 (refer to FIG. 5) that converts a pixel signal received through the first transmission line DL1 into digital data. The ADC circuit 21 may include an ADC1 for each first transmission line DL1 to convert a pixel signal received through each first transmission line DL1 into digital data.

The second selection/read-out circuit 17 may provide a signal for selecting a pixel PX of the pixel array 13 through the second selection line SL2 in the second direction, and read out a pixel signal received from the pixel array 13 through the second transmission line DL2 in a direction corresponding to the second direction (the second direction or the opposite direction). The second selection/read-out circuit 17 may be electrically connected to a plurality of second selection lines SL2 for providing a selection signal to the pixel array 13 in the second direction, and to the plurality of second transmission lines DL2 for transmitting a pixel signal of the selected pixel in the second direction to the second selection/read-out circuit 15 in a direction corresponding to the second direction. The second selection/read-out circuit 17 may include an ADC circuit 121 (refer to FIG. 5) that converts a pixel signal received through the second transmission line DL2 into digital data. The ADC circuit 121 may include an ADC2 for each second transmission line DL2 to convert a pixel signal received through each second transmission line DL2 into digital data.

A pixel to which the first selection line SL1 to which a selection signal is applied from the first selection/read-out circuit 15 and the second selection line SL2 to which a selection signal is applied from the second selection/read-out circuit 17 are electrically connected is selected, and a pixel signal generated from the selected pixel may be transmitted to the first selection/read-out circuit 15 through the first transmission line DL1 electrically connected to the corresponding pixel or may be transmitted to the second selection/read-out circuit 17 through the second transmission line DL2 electrically connected to the corresponding pixel.

As described above, the image sensor 10 according to an example embodiment includes the first selection line SL1 and the first transmission line DL1 connected to the plurality of pixels PX in the first direction, the second selection line SL2 and the second transmission line DL2 connected to the plurality of pixels PX in the second direction, the first selection/read-out circuit 15 that provides a selection signal to the first selection line SL1 and reads out a pixel signal transmitted through the first transmission line DL1, and the second selection/read-out circuit 17 that provides a selection signal to the second select line SL2 and reads out a pixel signal transmitted through the second transmission line DL2. The image sensor 10 according to an example embodiment may select a specific pixel of the pixel array 13 and read out a pixel signal generated from the selected pixel. In addition, the image sensor 10 according to an example embodiment may drive the first and second selection/read-out circuits 15 and 17 to select the plurality of pixels PX in line units, and thus, may read-out pixel signals generated from the plurality of pixels PX of the pixel array 13 in line units.

In this way, since the image sensor 10 according to an example embodiment may selectively read out a pixel signal generated from a specific pixel, an image of a region of interest may be acquired by reading out only information on a specific region of the image sensor 10. In addition, the image sensor 10 according to an example embodiment may read out information only from a plurality of separated regions, and may adjust the resolution of an image acquired from the image sensor 10 as intended by changing a separation distance between the plurality of regions. Accordingly, according to the image sensor 10 according to an example embodiment, a region or resolution at which an image is acquired in the pixel array 13 may be adjusted according to the user's intention.

For example, according to the image sensor 10 according to an example embodiment, as shown in FIG. 3 as an example, the image sensor 10 may be driven to extract pixel signals of all pixels in a region of interest (ROI: hatched region in FIG. 3) of the pixel array 13, may be driven to extract pixel signals of some selected pixels of the region of interest, or may be driven to have different resolutions of images acquired in the region of interest and in non-interest regions.

In FIG. 3, the hatched region represents a region of pixels driven to extract a pixel signal, and may correspond to a region of interest. FIG. 3 illustrates a case in which all pixels of a region of interest extract pixel signals, but the embodiment is not limited thereto.

For example, referring to FIG. 3, when the image sensor 10 is driven to extract pixel signals of all pixels of the region of interest, the image sensor 10 according to an example embodiment may acquire an image in the region of interest at a basic resolution of the pixel array 13, for example, at a high-resolution. When the image sensor 10 is driven to extract pixel signals of some selected pixels in the region of interest, the image sensor 10 according to an example embodiment may acquire an image in the region of interest at a resolution less than the basic resolution of the pixel array 13, that is, at a low resolution. In this way, the resolution of an image acquired in the region of interest may be adjusted by adjusting a distance between pixels selected in the region of interest. As another example, the image sensor 10 according to an example embodiment may be driven to have a resolution of an image acquired from a region of interest different from a resolution of an image acquired from a non-interest region. For example, the image sensor 10 according to an example embodiment may acquire an image having a high-resolution in the region of interest and acquire an image having a low-resolution in the non-interest region.

As another example, according to the image sensor 10 according to an example embodiment, as shown in FIG. 4 as an example, the image sensor 10 may be driven to extract pixel signals of pixels from an entire region of the pixel array 13 or may be driven to select pixels in a plurality of separated regions (hatched regions) from among the entire region of the pixel array 13 and to extract pixel signals of the selected pixels. The hatched regions in FIG. 4 represent selected pixels that are driven to extract pixel signals. FIG. 4 shows an example of selecting pixels of a plurality of separated regions of the pixel array 13 and extracting pixel signals from the selected pixels. When the image sensor 10 is driven to extract pixel signals of pixels from the entire region of the pixel array 13, the image sensor 10 according to an example embodiment may acquire an image at the basic resolution of the pixel array 13, that is, a high-resolution. When the image sensor 10 is driven to select pixels in a plurality of separated regions of the pixel array 13 and to extract pixel signals from the selected pixels, the image sensor 10 according to an example embodiment may acquire an image having a resolution less than a basic resolution, that is, a low-resolution. The resolution of an image acquired by adjusting a distance between the plurality of regions from which pixels are selected may be adjusted.

As described with reference to FIGS. 3 and 4, in the image sensor 10 according to an example embodiment, when an image having a resolution less than the basic resolution of the pixel array 13 is acquired, the pixels selected to read out a pixel signal may be located continuously or at least some of them may be located discontinuously. For example, the image sensor 10 may be driven to select a region including at least one selected pixel of the pixel array 13 at an interval of n pixels (here, n is a natural number greater than or equal to 1), and to extract pixel signals of selected pixels. Also, the image sensor 10 may be driven to select pixels of the pixel array 13 at irregular intervals and to extract pixel signals of the selected pixels. For example, when the pixel array 13 has an RGB Bayer pattern structure, the image sensor 10 may be driven to extract a pixel signal of some color pixels, for example, a red pixel R, a green pixel G or a blue pixel B, or two color pixels.

Meanwhile, in the example embodiment, the region of interest may correspond to a partial region of the pixel array 13, for example, a region of a predetermined range including the central region C of the pixel array 13, or may be a region of a predetermined range outside the center of the pixel array 13. Also, the region of interest may correspond to a plurality of regions separated from each other on the pixel array 13. Also, the region of interest may be an entire region of the pixel array 13. FIG. 3 exemplarily shows a case in which the region of interest is a region of a predetermined range including the central portion C of the pixel array 13.

Referring to FIGS. 1 and 2 again, the controller 19 may provide a control signal to the selected pixel of the pixel array 13, and control the first and second selection/read-out circuits 15 and 17 to read out information of the selected pixels.

When information of the region of interest ROI is read out, the controller 19 may control the first and second selection/read-out circuits 15 and 17, for example, to extract pixel information in a radial form from the central region C of the region of interest ROI of the pixel array 13.

As illustrated according to an example embodiment in FIG. 2, pixel information may be extracted in a radial form from the central region C of the region of interest ROI of the pixel array 13 by controlling the first and second selection/read-out circuits 15 and 17 so that the sequence PS of pixels from which pixel information of the region of interest ROI of the pixel array 13 is extracted is in a spiral form 18.

Meanwhile, the controller 19 may control the first and second selection/read-out circuits 15 and 17 to vary the resolution of an image acquired from the image sensor 10. For example, as described above with reference to FIGS. 3 and 4, when reading out pixel information from a plurality of non-contiguous regions of the pixel array 13, the controller 19 may control the first and second selection/read-out circuits 15 and 17 to select pixels in the plurality of non-contiguous regions of the pixel array 13 and extract pixel information from the selected pixels. In this case, pixel information may be extracted at a resolution lower than the basic resolution of the pixel array 13. That is, the controller 19 may control the first and second selection/read-out circuits 15 and 17 to select a pixel to extract pixel information at a resolution lower than the basic resolution of the pixel array 13, and to read-out a pixel signal from the selected pixel. In addition, the controller 19 may control the first and second selection/read-out circuits 15 and 17 to adjust intervals between a plurality of non-consecutive regions including selected pixels, and thus, the resolution of the acquired image may be changed.

As described above, according to the image sensor 10 according to an example embodiment, by including the first selection/read-out circuit 15 that provides a selection signal through the first selection line SL1 in a first direction and reads out the pixel signal of the selected pixel through the first transmission line DL1 and the second selection/read-out circuit 17 that provides a pixel selection signal through the second selection line SL2 in a second direction and reads out the pixel signal of the selected pixel through the second transmission line DL2, information of a pixel to which at least one selection line, to which a signal is applied, from among the plurality of first selection lines SL1 and at least one selection line, to which a signal is applied, from among the plurality of second selection lines SL2 are electrically connected may be read out.

Accordingly, the image sensor 10 according to an example embodiment may select a specific pixel on the pixel array 13 and read out a pixel signal from the selected pixel by controlling the first and second selection/read-out circuits 15 and 17, such that the image sensor 10 may selectively read out information of a specific region of the pixel array 13.

In addition, the image sensor 10 according to an example embodiment may select a specific pixel by controlling the first and second selection/read-out circuits 15 and 17, such that the resolution of an image acquired by the image sensor 10 may be adjusted by adjusting an interval of regions in which pixels are selected.

For example, in a basic resolution sensing mode of the image sensor 10 according to an example embodiment, the pixel array 13 may be driven to extract pixel information from consecutive pixels of the region of interest ROI or an entire region. Also, in a sensing mode with a resolution lower than the basic resolution of the image sensor 10 according to an example embodiment, the pixel array 13 may be driven to extract pixel information from a plurality of separated regions of a region of interest ROI or the entire region. When pixel information is extracted from a plurality of separated regions, the resolution of the image acquired from the image sensor 10 is lowered, but the total amount of pixel information may be reduced, thereby improving a frame rate. In addition, by adjusting the intervals between the plurality of regions from which pixel information is extracted, the resolution of the acquired image may be changed as intended, and the frame rate may be varied.

As described above, in the image sensor 10 according to an example embodiment, selective driving of pixels of the pixel array 13 may be possible by the first and second selection/read-out circuits 15 and 17, and by the selective driving of the pixels, an image of the region of interest ROI or the entire region may be acquired at a basic resolution, that is, a high-resolution, or may be acquired at a lower resolution than the basic resolution. When the image of the region of interest ROI or the entire region is acquired at a lower resolution than the basic resolution, the total amount of pixel information may be reduced, and thus, the frame rate may be improved.

Figure 5:
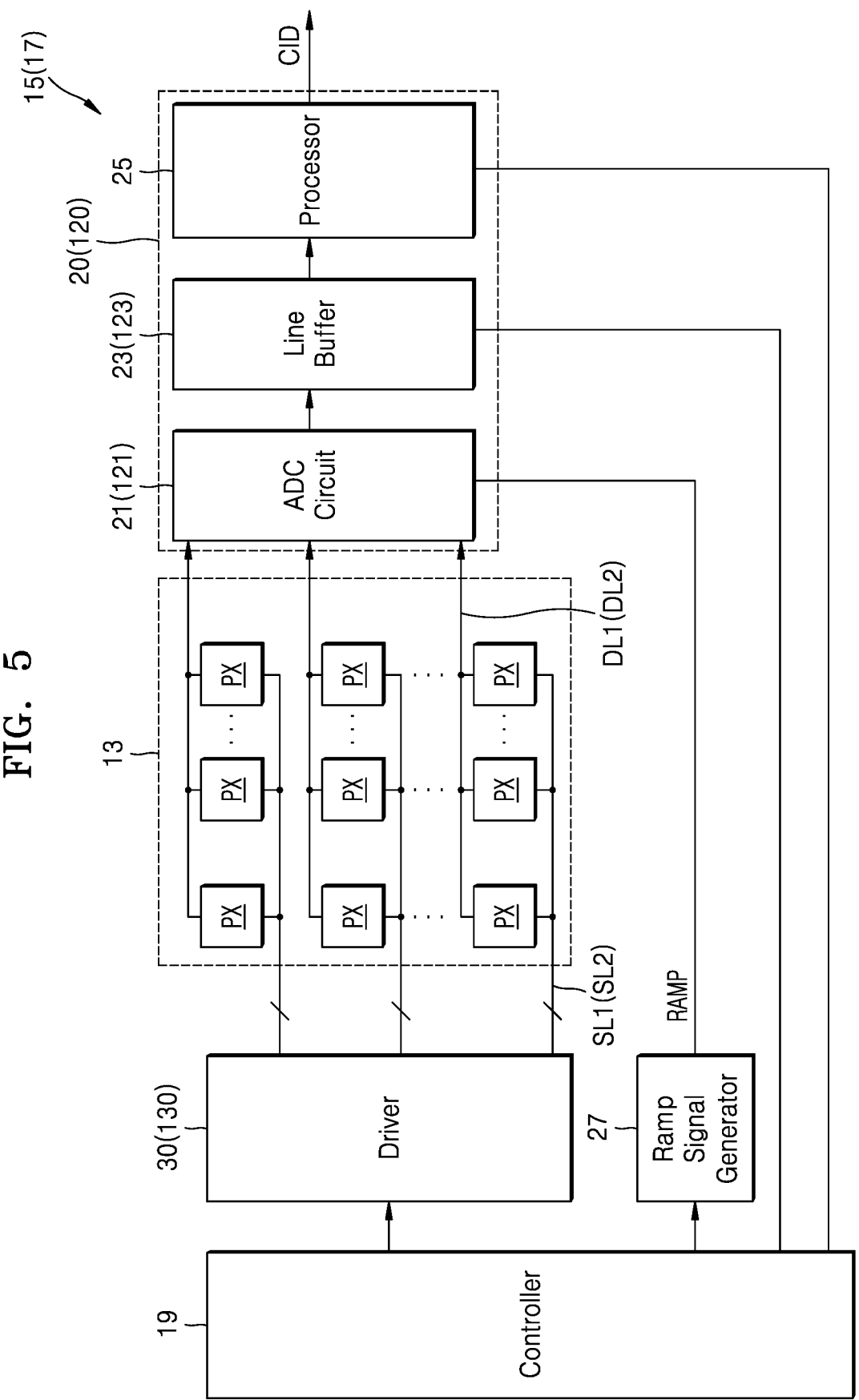
FIG. 5 shows first and second selection/readout circuits of an image sensor according to an example embodiment.

FIG. 5 exemplarily shows the first and second selection/read-out circuits 15 and 17 of the image sensor 10 according to an example embodiment.

Referring to FIG. 5, the first selection/read-out circuit 15 may include, for example, a driver 30 providing a signal for selecting a pixel of the pixel array 13 in a first direction, and a read-out circuit 20 reading out a plurality of pixel signals received from the pixel array 13 in the first direction. The second selection/read-out circuit 17 may include, for example, a driver 130 providing a signal for selecting a pixel of the pixel array 13 in the second direction, and a read-out circuit 120 reading out a plurality of pixel signals received from the pixel array 13 in the second direction.

As exemplarily shown in FIG. 5, in the image sensor 10 according to an example embodiment, the first and second selection/read-out circuits 15 and 17 respectively may include the drivers 30 and 130 and the read-out circuits 20 and 120. The read-out circuit 20 of the first selection/read-out circuit 15 may include an ADC circuit 21, a processor 25, a ramp signal generator 27, and the like, and also, may further include a line buffer 23, etc. The read-out circuit 120 of the second selection/read-out circuit 17 may include an ADC circuit 121, a processor 25, a ramp signal generator 27, and the like, and also may further include a line buffer 123, etc. The processor 25 may be commonly applied to the read-out circuits 20 and 120 of the first and second selection/read-out circuits 15 and 17, or may be provided separately in the read-out circuits 20 and 120, respectively. In addition, the ramp signal generator 27 may be commonly applied to the read-out circuits 20 and 120 of the first and second selection/read-out circuits 15 and 17, and may be provided separately in the read-out circuits 20 and 120, respectively.

The drivers 30 and 130 may generate control signals for driving the pixel array 13 under the control of the controller 19, and may provide the control signals to each of the plurality of pixels PX of the pixel array 123 through the plurality of first and second selection lines SL1 and SL2. The drivers 30 and 130 may control the plurality of pixels PX of the pixel array 13 to sense incident light. In addition, the drivers 30 and 130 may control the pixel array 13 to select a specific pixel from among the plurality of pixels PX and control the pixel signal of the selected pixel to be output through the first transmission line DL1 and/or the second transmission line DL2.

In the first selection/read-out circuit 15, the ADC circuit 21 may be arranged to convert a pixel signal received through the first transmission line DL1 into digital data. In the second selection/read-out circuit 17, the ADC circuit 121 may be arranged to convert a pixel signal received through the second transmission line DL2 into digital data.

The ADC circuit 21 or 121 may receive a pixel signal transmitted from the selected pixel PX through the first transmission line DL1 or the second transmission line DL2 and convert the pixel signal into a pixel value that is digital data. The ADC circuit 21 or 121 may generate and output image data by converting a pixel signal transmitted from the pixel array 13 through the first transmission line DL1 or second transmission line DL2 into digital data based on a ramp signal RAMP from the ramp signal generator 27. Each of the ADC circuits 21 and 121 may include a plurality of ADC1s or ADC2s corresponding to the plurality of first and second transmission lines DL1 or DL2, and each of the plurality of ADC1s or ADC2s may compare a pixel signal corresponding to the selected pixel PX received through the corresponding first transmission line DL1 or the second transmission line DL2 with a ramp signal RAMP, and may generate a pixel value based on the comparison results. For example, each of the ADC circuits 21 and 121 may remove a reset signal from a sensing signal by using a correlated double sampling (CDS) method and generate a pixel value indicating an amount of light sensed by the pixel PX.

Each of the line buffers 23 and 123 may include a plurality of line memories, and may store a plurality of pixel values output from the ADC circuits 21 and 121 in a predetermined row or column unit. In other words, each of the line buffers 23 and 123 may store image data output from the ADC circuits 21 and 121 in a predetermined row or column unit. For example, each of the line buffers 23 and 123 may include three line memories corresponding to three rows or columns of the pixel array 13, and pixel values of the selected pixels PX of three rows or columns of image data output from the ADC circuits 21 and 121 may be stored in the three line memories.

The processor 25 may process pixel values of the selected pixels PX of a plurality of rows or columns of image data stored in the line buffers 23 and 123. The processor 25 may perform image quality compensation, binning, downsizing, etc. on the image data stored in the line buffers 23 and 123, and may output image data CID.

The ramp signal generator 27 may generate a ramp signal RAMP that increases or decreases with a predetermined slope and provide the ramp signal RAMP to the ADC circuits 21 and 121.

The controller 19 may provide timing signals representing operation timings to each of the components constituting the first and second selection/read-out circuits 15 and 17, for example, the drivers 30 and 130, the ADC circuits 21 and 121 of the read-out circuits 20 and 120, the ramp signal generator 27, the line buffers 23 and 123, and the processor 25.

In FIG. 5, it is shown that the first selection line SL1 and the first transmission line DL1, and the second selection line SL2 and the second transmission line DL2 are all arranged in a horizontal direction. This is for convenience only, and the example arrangement of FIG. 5 does not limit the arrangement directions of the first selection line SL1 and the first transmission line DL1, and the second selection line SL2 and the second transmission line DL2. For example, the first selection line SL1 and the first transmission line DL1 may be arranged in a horizontal direction, and the second selection line SL2 and the second transmission line DL2 may be arranged in a vertical direction. Also, the first selection line SL1 and the first transmission line DL1 may be arranged in a vertical direction, and the second selection line SL2 and the second transmission line DL2 may be arranged in a horizontal direction.

In FIG. 5, it is shown that the drivers 30 and 130 and the read-out circuits 20 and 120 of the first and second selection/read-out circuits 15 and 17 are arranged opposite to each other with respect to the pixel array 13, but the example embodiment is not limited thereto. For example, the drivers 30 and 130 and the read-out circuits 20 and 120 of each of the first and second selection/read-out circuits 15 and 17 may be arranged on the same side of the pixel array 13. Also, in FIG. 5, it is shown that the first selection line SL1 and the first transmission line DL1 connected to the first selection/read-out circuit 15 are arranged on both sides of the pixel PX, but this is an example. As another example, the first selection line SL1 and the first transmission line DL1 may be disposed on the same side of the pixel PX. Also, in FIG. 5, it is shown that the second selection line SL2 and the second transmission line DL2 connected to the second selection/read-out circuit 17 are arranged on both sides of the pixel PX, but also this is an example. As another example, the second selection line SL2 and the second transmission line DL2 may be arranged on the same side of the pixel PX.

The first and second selection/read-out circuits 20 and 120 described with reference to FIG. 5 are only examples and the embodiment is not limited thereto, may continuously or non-continuously select pixels in a region of interest or an entire region and read out information of the selected pixels through the first transmission line DL1 and the first selection line SL1 extending in the first direction and the second transmission line DL2 and the second selection line SL2 extending in the second direction, and their practical configuration may be variously modified.

Referring back to FIGS. 1, 2 and 5, the pixel array 13 may include a plurality of pixels PX arranged in a matrix, and a plurality of first transmission lines DL1 and first selection lines SL1 and a plurality of second transmission lines DL2 and second selection lines SL2 that are connected to the plurality of pixels PX.

The plurality of first transmission lines DL1 and first selection lines SL1 may extend in the first direction, for example, a column direction, and each pair of first transmission line DL1 and first selection line SL1 may be connected to pixels PX arranged in the same column. For example, each of the plurality of first selection lines SL1 may transmit control signals output from the driver 30 of the first selection/read-out circuit 15 to each of elements, for example, a plurality of transistors of the pixel circuit provided in the pixel PX, and each of the plurality of first transmission lines DL1 may transmit a pixel signal, for example, a reset signal and a sensing signal output from the selected pixels PX of the pixel array 13 to the read-out circuit 20 of the first selection/read-out circuit 15. For example, some of the plurality of first transmission lines DL1 may transmit pixel signals in units of at least two columns.

The plurality of second transmission lines DL2 and the second selection lines SL2 may extend in the second direction, for example, in a row direction, and each of the second transmission lines DL2 and the second selection lines SL2 forming a pair may be connected to pixels PXs arranged in the same row. For example, each of the plurality of second selection lines SL2 may transmit control signals output from the driver 130 of the second selection/read-out circuit 17 to devices, for example, each of the plurality of transistors included in the pixel PX, and each of the plurality of second transmission lines DL2 may transmit a pixel signal, for example, a reset signal and a sensing signal output from the selected pixels PX of the pixel array 13 to the read-out circuit 120 of the second selection/read-out circuit 17. For example, some of the plurality of second transmission lines DL2 may transmit pixel signals in units of at least two rows.

According to the image sensor 10 according to an example embodiment, at least one selection line from among the plurality of first selection lines SL1 for providing a selection signal to the pixels of the pixel array 13 in the first direction and at least one selection line from among the plurality of second selection lines SL2 for providing a selection signal to the pixels of the pixel array 13 in the a second direction may be electrically connected to a pixel of the pixel array 13 to apply a selection signal through the first and second selection lines SL1 and SL2 to select a pixel. In addition, information on a pixel selected by applying a selection signal through the first and second selection lines SL1 and SL2 may be read out through the first transmission line DL1 and/or the second transmission line DL2. The pixel signal transmitted through the first transmission line DL1 may be converted into digital data in the ADC circuit 21 of the first selection/read-out circuit 15, and the pixel signal transmitted through the second transmission line DL2 may be converted into digital data in the ADC circuit 121 of the second selection/read-out circuit 17.

Meanwhile, according to the image sensor 10 according to an example embodiment, a region of interest ROI may be set, and pixel information in the region of interest ROI may be radially extracted. Here, the region of interest ROI may be set to a predetermined range including or not including a central region of the pixel array 13, or may be set to the entire region of the pixel array 13. For example, when the center C of the region of interest ROI corresponds to the center of the pixel array 13, the image sensor 10 according to an example embodiment may radially extract pixel information from the center of the pixel array 13. Here, when radially extracting pixel information, for example, as shown in FIG. 2, the sequence PS of pixels for extracting pixel information may have a spiral form 18.

Also, according to the image sensor 10 according to an example embodiment, a resolution of image data to be acquired may be set, a pixel in a discontinuous region from which pixel information is read out to secure the set resolution may be selected, and pixel information from the selected pixel may be acquired.

Figure 6A:
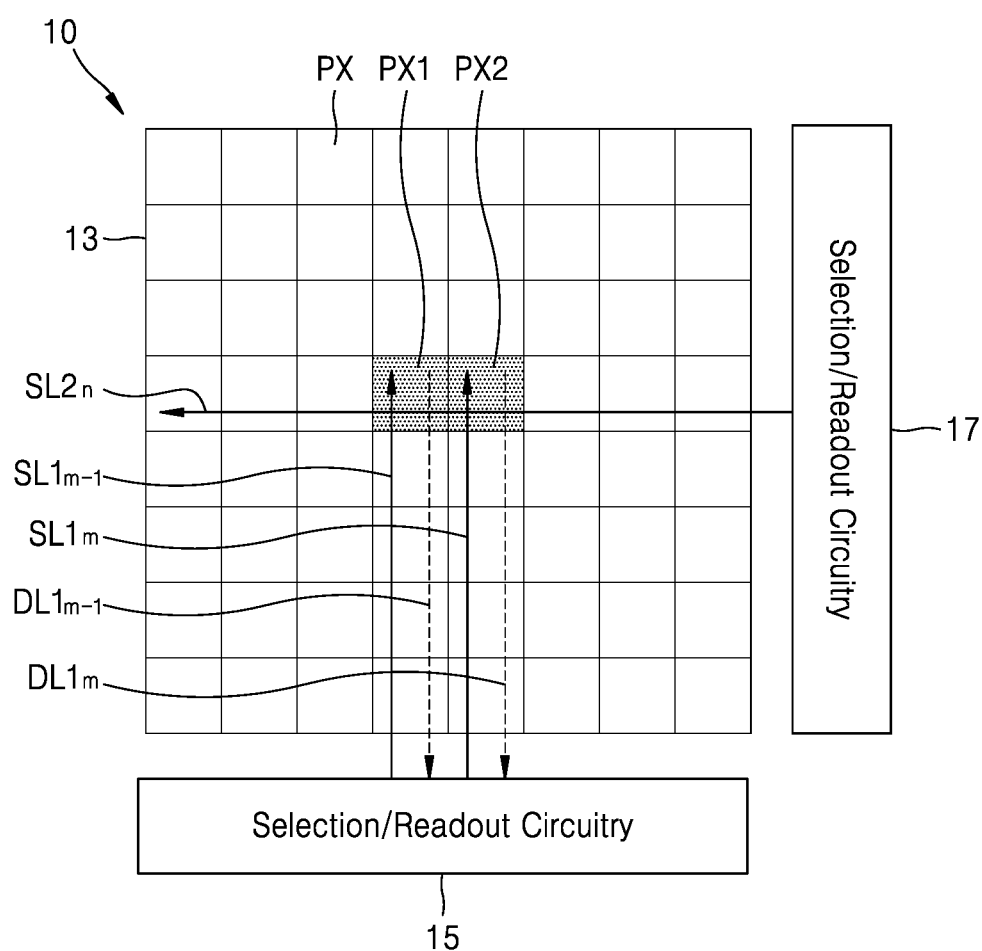
FIGS. 6A to 6C show a process of radially extracting pixel information from the center of a pixel array of an image sensor according to an example embodiment.
Figure 6B:
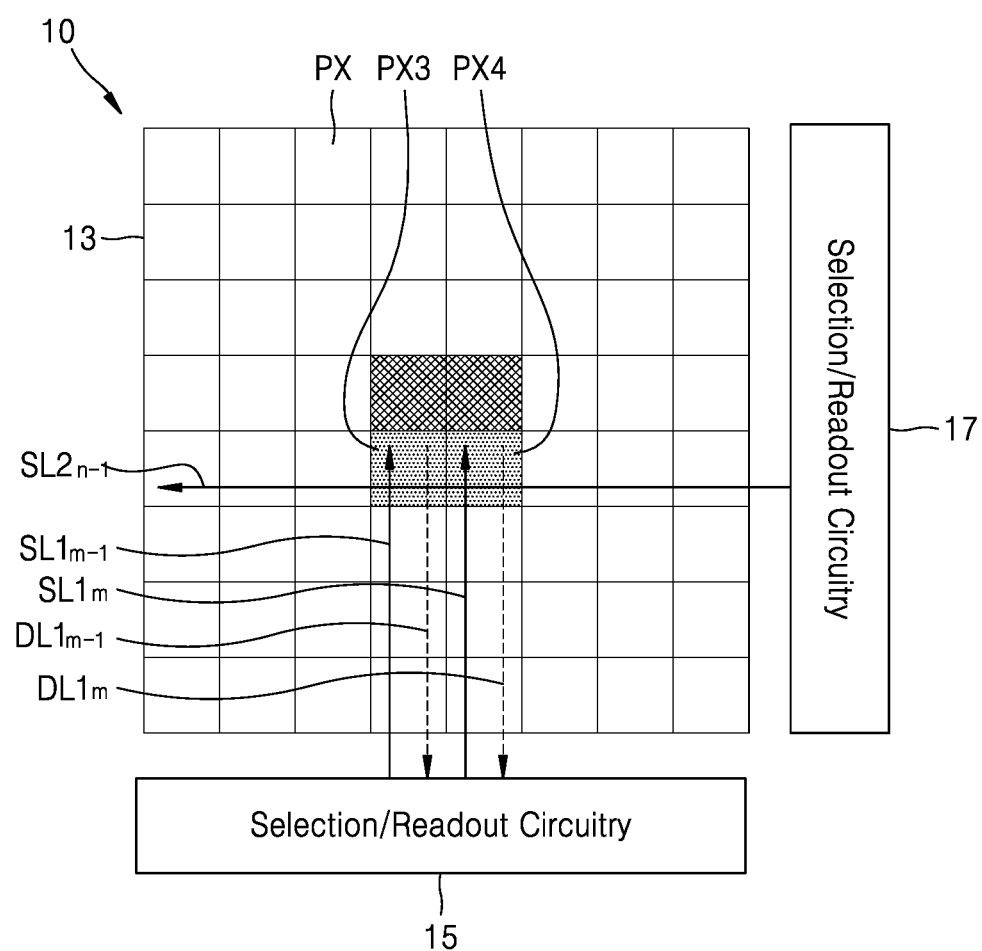
Figure 6C:
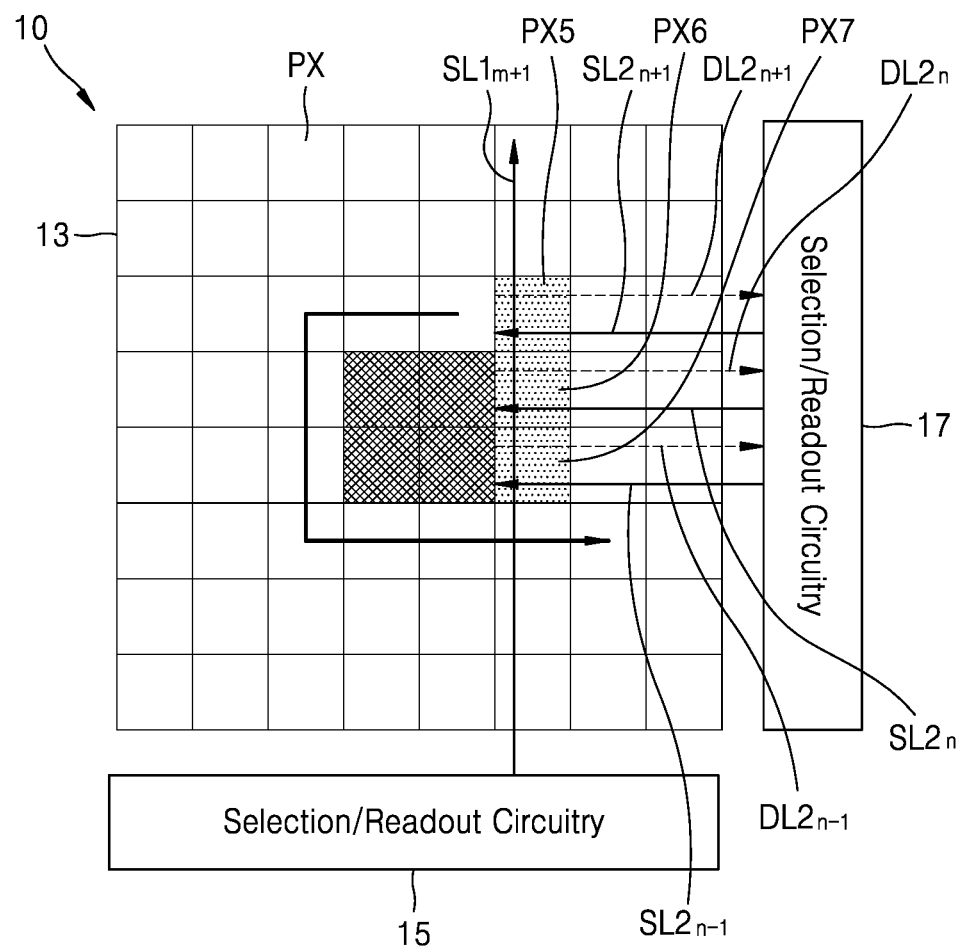

FIGS. 6A to 6C show, as an example, a process of radially extracting pixel information from the center of the pixel array 13 of the image sensor 10 according to an example embodiment. Hereinafter, for example, an $m^{th}$ first selection line SL1 and the first transmission line DL1 are indicated as SL1$m$ and DL1$m$, respectively, and an $n^{th}$ second selection line SL2 and the second transmission line DL2 are indicated as SL2$n$ and DL2$n$, respectively, a pixel selected by applying a driving signal through the $m^{th}$ first selection line SL1$m$ and the $n^{th}$ second selection line SL2$n$ is indicted as a pixel (m,n), and pixel information from the pixel (m,n) is indicated as being transmitted to the first selection/read-out circuit 15 through the first transmission line DL1$m$ or to the second selection/read-out circuit 17 through the second transmission line DL2$n$.

Referring to FIG. 6A, when a driving signal is applied from the second selection/read-out circuit 17 through the $n^{th}$ second selection line SL2$n$, and a driving signal is applied from the first selection/read-out circuit 15 through the m-1$^{th}$ and m$^{th}$ first selection lines SL1$m$-1 and SL1$m$, a pixel (m,n) (PX1) and a pixel (m-1,n) (PX2) are selected, and pixel information of the selected pixel (m,n) (PX1) and pixel (m-1,n) (PX2) is transmitted to the first selection/read-out circuit 15 through two corresponding first transmission lines DL1$m$ and DL1$m$-1.

Referring to FIG. 6B, when a driving signal is applied from the second selection/read-out circuit 17 through the n-1$^{th}$ second select line SL2$n$-1, and a driving signal is applied from the first selection/read-out circuit 15 through the m-1$^{th}$ and m$^{th}$ first selection lines SL1$m$-1 and SL1$m$, a pixel (m-1,n-1) (PX3) and a pixel (m,n-1) (PX4) are selected, and pixel information of the selected pixel (m-1, n-1) (PX3) and pixel (m,n-1) (PX4) is transmitted to the first selection/read-out circuit 15 through two corresponding first transmission lines DL1$m$−1 and DL1$m$.

Referring to FIG. 6C, a driving signal is applied from the first selection/read-out circuit 15 through the m+1$^{th}$ first selection line SL1$m$+1, and a driving signal is applied from the second selection/read-out circuit 17 through the n+1$^{th}$, n$^{th}$, n−1$^{th}$ second selection lines SL2$n$+1 SL2$n$, and SL2$n$−1, a pixel (m+1, n−1) (PX5), a pixel (m+1,n) (PX6), and a pixel (m+1,n+1) (PX7) are selected, and pixel information of the selected pixel (m+1,n−1) (PX5), pixel (m+1,n) (PX6), and pixel (m+1,n+1) (PX7) is transmitted to the second selection/read circuit 17 through corresponding three second transmission lines DL2$n$−1, DL2$n$, and DL2$n$+1.

As exemplarily shown in the operation of FIGS. 6A to 6C, according to the image sensor 10 according to an example embodiment, pixel information in the region of interest ROI may be radially extracted, and when the pixel information is radially extracted, the sequence PS of pixels from which the pixel information is extracted may have a spiral form 18.

Figure 7:
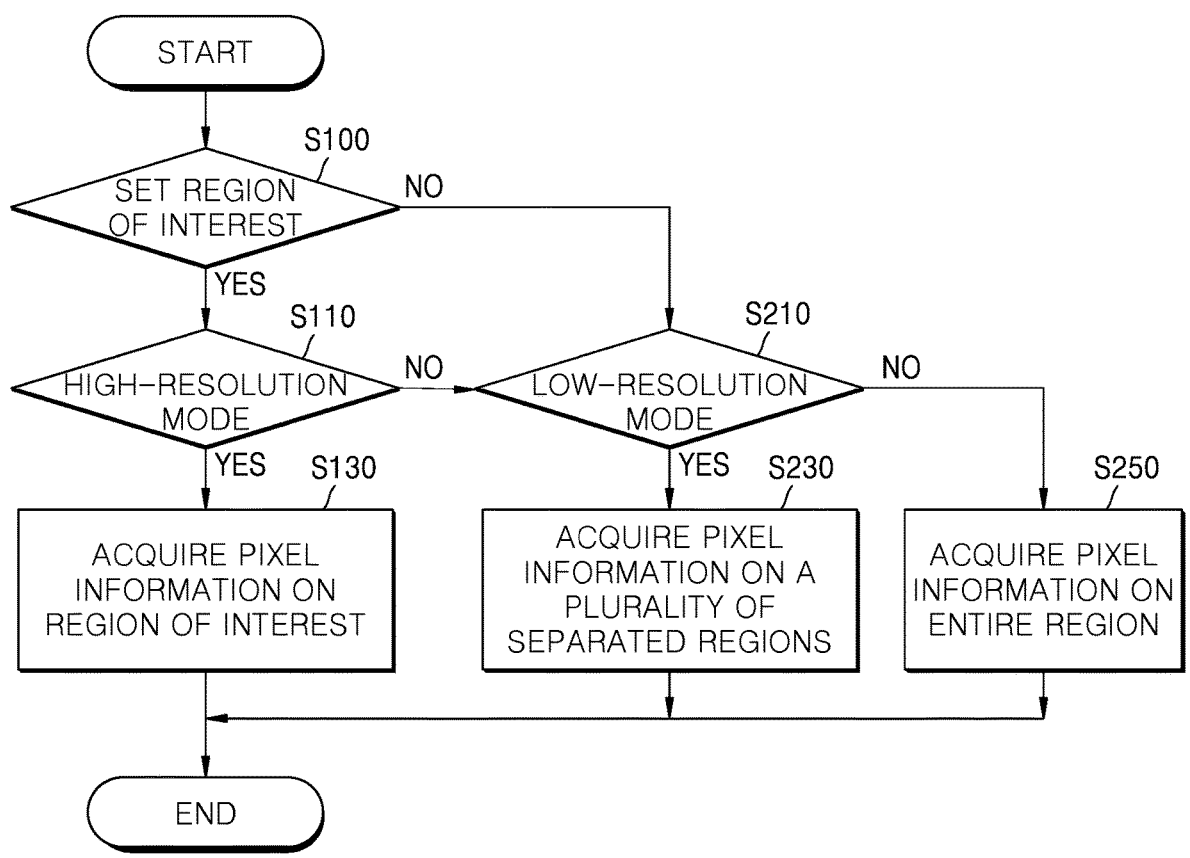
FIG. 7 is a flowchart illustrating an operating method of an image sensor according to an example embodiment.

FIG. 7 is a flowchart illustrating an example of a method of operating the image sensor 10 according to an example embodiment.

Referring to FIGS. 1, 2, and 7, the image sensor 10 may set a region of interest ROI from which pixel information is read out (S100). The region of interest ROI may be a region including a predetermined range of the pixel array 13. The region of interest ROI may include, for example, the central region C of the pixel array 13, or may be a region of a predetermined range outside the central portion C of the pixel array 13. Next, it is determined whether to read out the pixel information of the region of interest ROI in a high-resolution mode, which is the basic resolution of the pixel array 13 (S110). Then, high-resolution image data may be acquired by reading out the pixel information of the region of interest ROI in the high-resolution mode (S130). Even when the region of interest ROI is set, it may be determined whether to read out pixel information of the region of interest ROI in a low-resolution mode less than the basic resolution of the pixel array 13 (S210). And, when the pixel information of the region of interest ROI is read out in a low-resolution mode, low-resolution image data for the region of interest ROI may be acquired by acquiring pixel information from a plurality of separated regions of the region of interest ROI in operation S230.

As another example, a region of interest ROI is set (S100), and the region of interest ROI is read out in a high-resolution mode to acquire high-resolution image data (S110, S130), and for regions other than the region of interest ROI of the pixel array 13, low-resolution image data may be acquired by reading out in a low-resolution mode that acquires pixel information in a plurality of separated regions (S210, S230).

Meanwhile, when the image sensor 10 is operated without setting a region of interest ROI, in operation S210, it is determined whether to read out pixel information at a lower resolution than a high-resolution that is a basic resolution of the pixel array 13. In a low-resolution mode, low-resolution image data for the entire region of the pixel array 13 may be acquired by reading out pixel information from a plurality of separated regions of the pixel array 13 (S230).

Meanwhile, the image sensor 10 may read out pixel information of the pixel array 13 in a high-resolution mode while operating without setting a region of interest ROI. That is, when it is determined in operation S210 to read out pixel information of the pixel array 13 in a mode other than the low-resolution mode, that is, in a high-resolution mode, high-resolution image data for the entire region of the pixel array 13 may be acquired by reading out pixel information for all pixels of the pixel array 13 (S250).

As described above, according to the image sensor 10 and the method of operating the image sensor 10 according to the embodiment, by providing the first and second selection/read-out circuits 15 and 17, a selective read-out of pixel information for a specific pixel is possible, thus, high-resolution image data may be acquired by reading out pixel information only from the region of interest ROI of the pixel array 13, or low-resolution image data may be acquired by reading out pixel information for a plurality of regions separated from each other in a non-interested region or the entire pixel array 13, and the resolution of acquired image data may be changed by changing the separation distance of a plurality of regions.

According to the image sensor 10 and its operating method according to an example embodiment, information on a region of interest ROI may be selectively read out, and when the center of a sensing region of the image sensor 10, that is, the center of the pixel array 13 is the region of interest ROI, pixel information may be radially extracted from the center by operations of the first and second selection/read-out circuits 15 and 17. As described above, according to the image sensor 10 and its operating method according to an example embodiment, it is possible to form an arbitrary frame by reading out only information of a specific area, and because the resolution may be varied, a frame rate and an amount of frame information may be varied depending on the information characteristics.

In addition, according to the image sensor 10 and its operating method according to an example embodiment, pixel information may be transmitted in a continuous serial or packet form by the operations of the first and second selection/read-out circuits 15 and 17. Also, even when the image sensor 10 according to an example embodiment is implemented as a high-resolution image sensor, the resolution of the image sensor 10 may be adjusted to an arbitrary resolution by a selective read-out method. For example, when the image sensor 10 according to an example embodiment is implemented with, for example, a 4M pixel resolution, the image sensor 10 may have an arbitrary resolution of 4M pixels or less by selective read-out, and thus, may be used as an image sensor having an improved frame rate.

The image sensor 10 and its operating method according to an example embodiment may be applied to an electronic device having an image or light sensing function. For example, the image sensor 10 may be mounted on an electronic device, such as a camera, a security camera, a medical camera, a robot, a smart phone, a wearable device, an Internet of Things (IoT) device, a home appliance, a tablet personal computer (PC), a personal digital assistant (PDA), a portable multimedia player (PMP), a navigation system, a drone, and an advanced driver assistance system (ADAS), etc. In addition, the image sensor 10 may be mounted in an electronic device provided as a component in a vehicle, furniture, manufacturing equipment, doors, various measurement devices, and the like.

Figure 8:
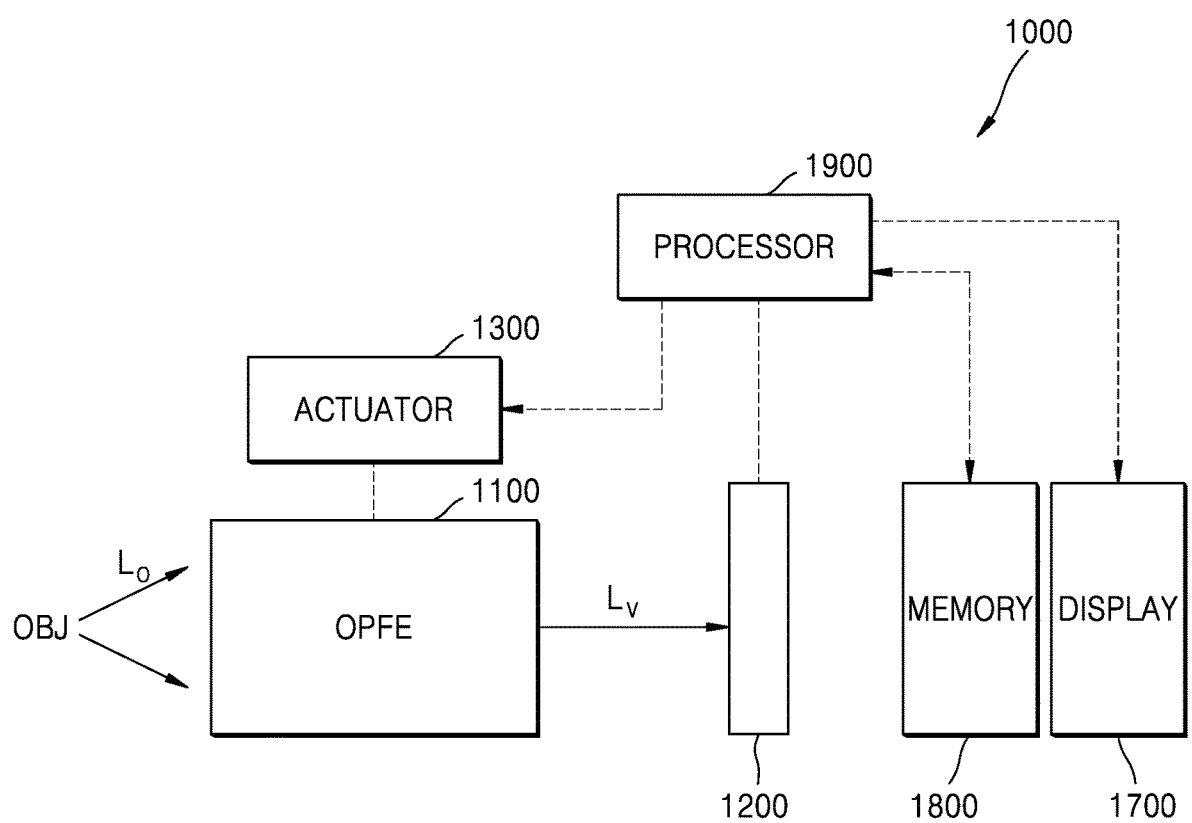
FIG. 8 is a block diagram illustrating a schematic configuration of an electronic device according to an example embodiment.

FIG. 8 is a block diagram illustrating a schematic configuration of an electronic device 1000 according to an example embodiment.

Referring to FIG. 8, the electronic device 1000 according to an example embodiment may include an image sensor 1200 and a processor 1900 for processing a signal from the image sensor 1200, and may be an image capturing device capable of acquiring image information on an object OBJ.

The electronic device 1000 may also include an optical path folding element (OPFE) 1110 configured to form an image of the object OBJ at a position of the image sensor 1200, and an actuator 1300 for driving the OPFE 1100.

The electronic device 1000 may also include a memory 1800 for storing a program code or data required for execution of the processor 1900 and a display unit 1700 for displaying an image.

The OPFE 1100 may include optical lenses of m groups. The OPFE 1100 may also include a path changing member for bending a path of light from the object OBJ to direct the light Lv towards the image sensor 1200. Depending on whether the path changing member is provided and the arrangement form of the optical lens, the OPFE 1100 may be referred to as a vertical form or a folded form. The optical lens and the path changing member may be moved by the actuator 1300.

For example, the optical lens included in the OPFE 1100 may move along an optical axis, and accordingly, an optical zoom magnification may be adjusted. When the basic optical zoom magnification is Z, the optical zoom magnification may be changed to 3Z or 5Z or higher optical zoom magnification by moving at least some of the optical lenses included in the OPFE 1110 to adjust a distance between adjacent lenses.

The actuator 1300 may drive at least a portion of components included in the OPFE 1110. The actuator 1300 may adjust the position of the optical lens so that the image sensor 1200 is located at a focal length of the optical lens and implements a desired zoom magnification.

The image sensor 1200 may be provided to sense, for example, visible light or infrared light. As the image sensor 1200, the image sensor 10 according to an example embodiment described above or a modified form thereof may be employed.

Light from the object OBJ forms an image on the image sensor 1200 by the OPFE 1110. Light $L_o$ from the object OBJ is incident on the image sensor 1200.

The processor 1900 may process a signal from the image sensor 1200, and also control an overall operation of the electronic device 1000, for example, the actuator 1300.

Meanwhile, the electronic device 1000 may further include an illumination unit for irradiating infrared light onto the object OBJ, and an infrared sensor for sensing infrared light. The infrared sensor may be provided integrally with the image sensor 1200.

For example, the image sensor 1200 may be provided to sense visible light, and the infrared sensor may be formed in a stacked structure on the image sensor 1200 to sense visible light and infrared light substantially simultaneously.

This structure, for example, in order to acquire visible light information and infrared information about an object, does not use a method of spatially dividing an optical path, dividing a resolution space of the image sensor 1200, or temporally dividing visible light sensing and infrared sensing, and therefore, the structure is simple and image processing may also be simplified.

In the case when the electronic device 1000 further includes an illumination unit and an infrared sensor, the processor 1900 may process a signal from the infrared sensor and may, for example, control the illumination unit.

The illumination unit may include a light source, such as a laser diode (LD), a light-emitting diode (LED), or a super luminescent diode (SLD) that generates and emits light in an infrared band. Such a light source may be configured to irradiate light in an infrared band, for example, in a wavelength band of about 750 nm or more and about 2500 nm or less. The illumination unit may also include a configuration for irradiating light modulated with a predetermined frequency to the object OBJ, and may further include an optical member for adjusting a path or range of the irradiated light.

In this way, when the illumination unit and the infrared sensor are further included, the processor 1900 may calculate depth information about an object from the infrared image information, and combine it with visible light image information to provide a 3D image of the object. Alternatively, the processor 1900 may calculate information about temperature or moisture of an object from the infrared image information, and may provide an image of temperature distribution and moisture distribution combined with a two-dimensional image of the object.

In order for the processor 1900 to acquire depth information from light sensed by the infrared sensor, a time of flight (TOF) method may be used. The TOF method is introduced to acquire more accurate distance information, and is a method of irradiating a beam to an object OBJ and measuring a light flight time until the beam is reflected from the object OBJ and received by a light receiver. According to the TOF method, after irradiating light of a specific wavelength (for example, near infrared rays of 850 nm) to an object OBJ, light of the same wavelength reflected from the object OBJ is received at the light receiver, and a special processing procedure for extracting distance information will go through. Various TOF methods are known according to the series of light processing procedures. For example, in a direct time measurement method, a distance is acquired by irradiating pulsed light onto an object OBJ, and measuring the time it takes for the light to return after being reflected by the object OBJ with a timer. In a correlation method, a distance is measured from brightness of light reflected by the object OBJ after irradiating a pulsed light onto the object OBJ. A phase delay measurement method is a method in which continuous wave light, such as a sine wave is irradiated onto an object OBJ, a phase difference of the light reflected by the object OBJ is detected, and the phase difference is converted into a distance.

For example, the processor 1900 may calculate depth image information of the object OBJ according to any one of the above-described methods, and may form a 3D image by combining the acquired depth image information with color image information.

Figure 9:
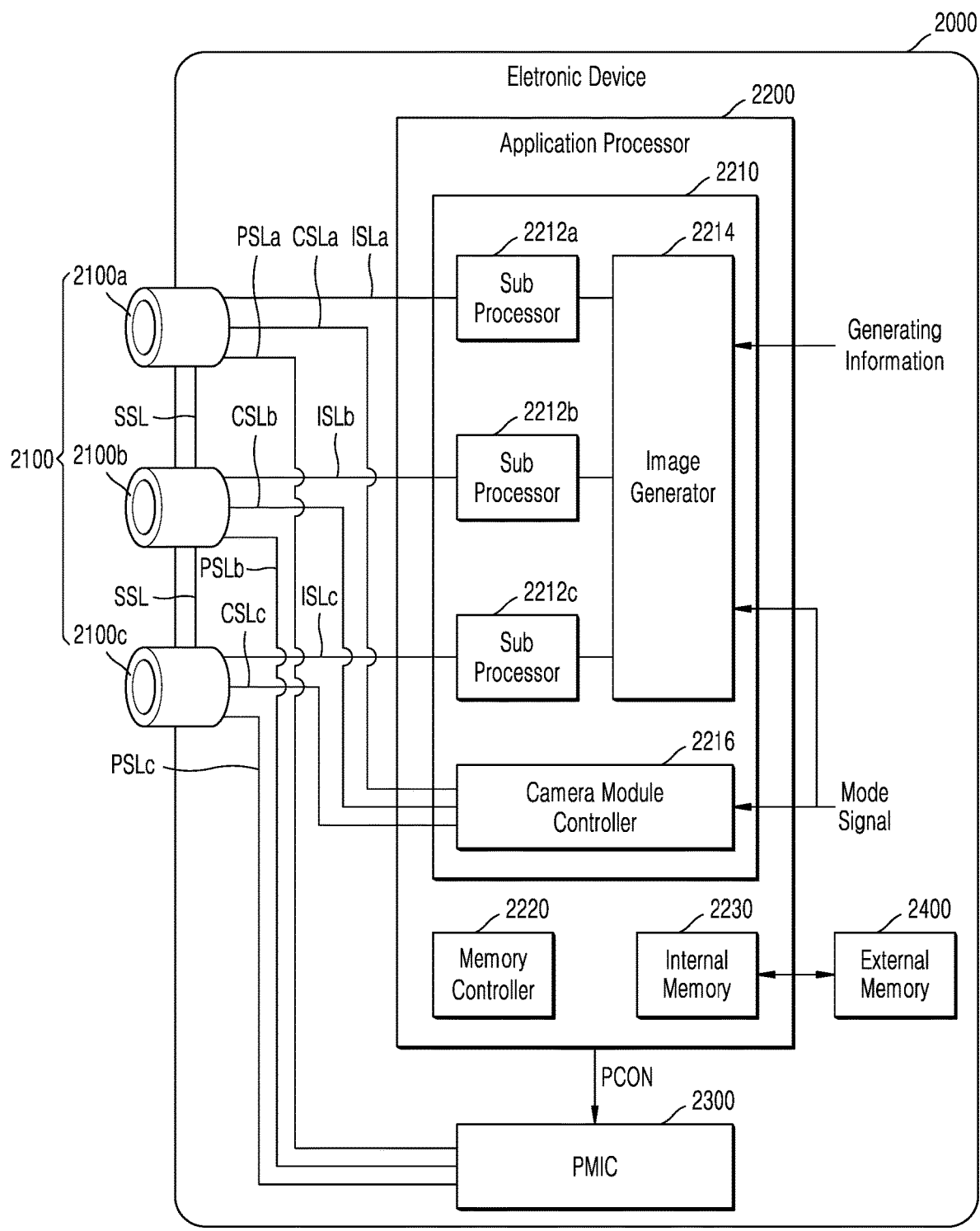
FIG. 9 is a block diagram illustrating a schematic configuration of an electronic device according to another example embodiment.
Figure 10:
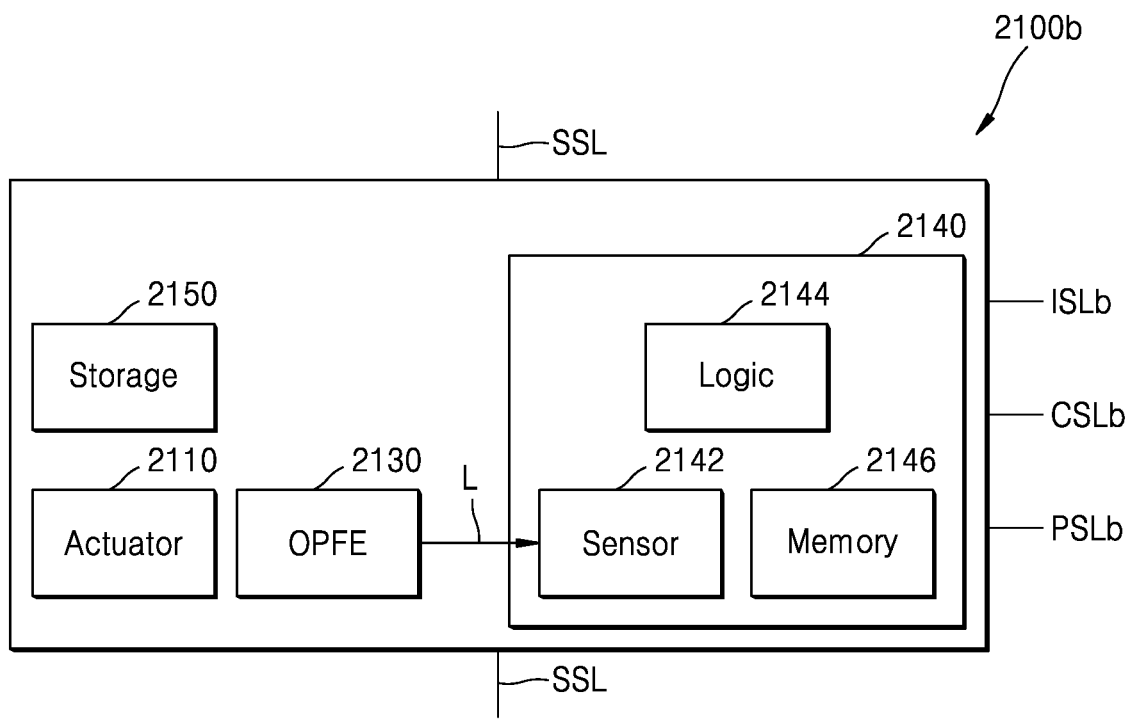
FIG. 10 is a block diagram showing a schematic configuration of a camera module provided in the electronic device of FIG. 9.

FIG. 9 is a block diagram showing a schematic configuration of an electronic device 2000 according to another embodiment, and FIG. 10 is a block diagram showing a schematic configuration of a camera module 2100b provided in the electronic device 2000 of FIG. 9.

The electronic device 2000 according to the example embodiment may be a device having an application utilizing a multi-camera module.

Referring to FIG. 9, the electronic device 2000 may include a camera module group 2100, an application processor 2200, a PMIC 2300, and an external memory 2400.

The camera module group 2100 may include a plurality of camera modules 2100a, 2100b, and 2100c. Although the drawing shows an example embodiment in which three camera modules 2100a, 2100b, and 2100c are disposed, the embodiment is not limited thereto. In some embodiments, the camera module group 2100 may be modified to include only two camera modules. Also, in some embodiments, the camera module group 2100 may be modified to include n (n is a natural number greater than or equal to 4) number of camera modules.

Referring to FIG. 10, a detailed configuration of the camera module 2100b included in the electronic device 2000 of FIG. 9 will be described. The camera module 2100*b* illustrated in FIG. 10 may be applied to other camera modules 2100*a* and 2100*c*.

Referring to FIG. 10, the camera module 2100*b* may include an image sensing device 2140, an OPFE 2130, an actuator 2110, and a storage unit 2150. The image sensing device 2140 includes an image sensor 2142, a control logic 2144, and a memory 2146.

The OPFE 2130 may include one or more optical lenses, and may include a path changing member for bending a path of light to direct light to the image sensor 2142. The camera module 2100*b* may have a vertical form or a folded form depending on whether the path changing member is provided and the arrangement shape with the optical lens.

The actuator 2110 may drive OPFE 2130. At least some of the optical lenses and the path changing member constituting the OPFE 2130 may be moved by the actuator 2110. The actuator 2110 may adjust the position of the optical lens so that the image sensor 2142 is located at a focal length of the optical lens and a desired zoom magnification is implemented.

The optical lens may move along an optical axis, and thus, the optical zoom magnification may be adjusted. When a basic optical zoom magnification is Z, the optical zoom magnification may be changed to 3Z or 5Z or higher optical zoom magnification by moving at least some of the optical lenses included in the OPFE 1110 to adjust a distance between adjacent lenses.

As the image sensor 2142, the image sensor 10 according to an example embodiment described above may be employed.

The control logic 2144 may control an overall operation of the camera module 2100*b*. For example, the control logic 2144 may control the operation of the camera module 2100*b* according to a control signal provided through the control signal line CSLb.

The memory 2146 may store information necessary for the operation of the camera module 2100*b*, such as, calibration data. The calibration data may include information necessary for the camera module 1100*b* to generate image data by using light L provided from the outside. The calibration data may include, for example, information related to the actuator 2110 driving the OPFE 2130, information about a focal length of an optical lens, information about an optical axis, etc. When the camera module 1100*b* is implemented in the form of a multi-state camera in which a focal length is changed according to the position of the optical lens, the calibration data 1147 may include a focal length value for each position (or state) of the optical lens and information related to auto focusing.

The storage unit 2150 may store image data sensed by the image sensor 2142. The storage unit 2150 may be disposed outside the image sensing device 2140, and may be implemented in a stacked form with a sensor chip constituting the image sensing device 2140. In some embodiments, the storage unit 2150 may be implemented as an Electrically Erasable Programmable Read-Only Memory (EEPROM), but the example embodiments are not limited thereto.

Referring back to FIG. 9, the application processor 2200 may include an image processing apparatus 2210, a memory controller 2220, and an internal memory 2230. The application processor 2200 may be implemented separately from a plurality of camera modules 2100*a*, 2100*b*, and 2100*c*. For example, the application processor 2200 and the plurality of camera modules 2100*a*, 2100*b*, and 2100*c* may be implemented by being separated from each other as separate semiconductor chips.

The image processing apparatus 2210 may include a plurality of sub-image processors 2212*a*, 2212*b*, and 2212*c*, an image generator 2214, and a camera module controller 2216.

The image processing apparatus 2210 may include the plurality of sub-image processors 2212*a*, 2212*b*, and 2212*c* corresponding to the number of the plurality of camera modules 2100*a*, 2100*b*, and 2100*c*.

Image data generated from each of the camera modules 2100*a*, 2100*b*, and 2100*c* may be provided to the corresponding sub-image processors 2212*a*, 2212*b*, and 2212*c* through image signal lines ISLa, ISLb, and ISLc that are separated from each other. For example, image data generated from the camera module 2100*a* is provided to the sub-image processor 2212*a* through an image signal line ISLa, image data generated from the camera module 2100*b* is provided to the sub-image processor 2212*b* through the image signal line ISLb, and image data generated from the camera module 2100*c* may be provided to the sub-image processor 2212*c* through the image signal line ISLc. Such image data transmission may be performed by using, for example, a Camera Serial Interface (CSI) based on a Mobile Industry Processor Interface (MIPI), but the example embodiments are not limited thereto.

In some embodiments, one sub-image processor 2212*b* may be arranged to correspond to a plurality of camera modules. For example, the sub-image processor 2212*a* and the sub-image processor 2212*c* may be not implemented separately from each other as shown in FIG. 9, but may be integrated and implemented as one sub-image processor 2212*b*, and image data provided from the camera module 2100*a* and the camera module 2100*c* may be selected through a selection element (e.g., a multiplexer) and then provided to the integrated sub-image processor 2212*b*.

Image data provided to each of the sub-image processors 2212*a*, 2212*b*, and 2212*c* may be provided to the image generator 2214. The image generator 2214 may generate an output image by using image data provided from each of the sub-image processors 2212*a*, 2212*b*, and 2212*c* according to image generating information or a mode signal.

Specifically, the image generator 2214 may generate an output image by merging at least some of the image data generated from the camera modules 2100*a*, 2100*b*, and 2100*c* having different viewing angles from each other according to image generation information or a mode signal. Also, the image generator 2214 may generate an output image by selecting any one of image data generated from the camera modules 2100*a*, 2100*b*, and 2100*c* having different viewing angles according to the image generation information or the mode signal.

In some embodiments, the image generation information may include a zoom signal or zoom factor. Also, in some embodiments, the mode signal may be, for example, a signal based on a mode selected by a user.

When the image generation information is a zoom signal (zoom factor) and each of the camera modules 2100*a*, 2100*b*, and 2100*c* has different viewing angles from each other, the image generator 2214 may perform different operations according to the type of the zoom signal. For example, when the zoom signal is a first signal, after merging image data output from the camera module 2100*a* with image data output from the camera module 2100*c*, an output image may be generated by using the merged image signal and image data output from the camera module 2100*b* not used for merging. If the zoom signal is a second signal different from the first signal, the image generator 2214 may generate an output image by selecting any one of the image data output from each camera module 2100a, 2100b, 2100c without performing such merging of the image data. However, the embodiments are not limited thereto, and a method of processing image data may be modified and implemented as needed.

In some embodiments, the image generator 2214 may receive a plurality of image data having different exposure times from at least one of the plurality of sub-image processors 2212a, 2212b, and 2212c, and may generate merged image data having an increased dynamic range by performing a high dynamic range (HDR) processing with respect to the plurality of image data.

A camera module controller 2216 may provide a control signal to each of the camera modules 2100a, 2100b, and 2100c. A control signal generated from the camera module controller 2216 may be provided to the corresponding camera modules 2100a, 2100b, and 2100c through the control signal lines CSLa, CSLb, and CSLc separated from each other.

Any one of the plurality of camera modules (2100a, 2100b, 2100c) may be designated as a master camera (e.g., 2100b) according to image generation information or a mode signal including a zoom signal, and the remaining camera modules (e.g., 2100a and 2100c) may be designated as slave cameras. Such information may be included in the control signal and provided to the corresponding camera modules 2100a, 2100b, and 2100c through the control signal lines CSLa, CSLb, and CSLc separated from each other.

Camera modules operating as a master and a slave may be changed according to a zoom factor or an operation mode signal. For example, when a viewing angle of the camera module 2100a is greater than that of the camera module 2100b and a zoom factor indicates a low zoom magnification, the camera module 2100b may be operated as a master, and the camera module 2100a may be operated as a slave. Conversely, when the zoom factor indicates a high zoom magnification, the camera module 2100a may be operated as a master and the camera module 2100b may be operated as a slave.

In some embodiments, a control signal provided from the camera module controller 2216 to each of the camera modules 2100a, 2100b, and 2100c may include a sync enable signal. For example, when the camera module 2100b is a master camera and the camera modules 2100a and 2100c are slave cameras, the camera module controller 2216 may transmit a sync enable signal to the camera module 2100b. The camera module 2100b receiving the sync enable signal may generate a sync signal based on the received sync enable signal, and transmit the generated sync signal to the camera modules 2100a and 2100c through a sync signal line SSL. The camera module 2100b and the camera modules 2100a and 2100c may be synchronized with the sync signal and transmit image data to the application processor 2200.

In some embodiments, a control signal provided from the camera module controller 2216 to the plurality of camera modules 2100a, 2100b, and 2100c may include mode information according to a mode signal. Based on the mode information, the plurality of camera modules 2100a, 2100b, and 2100c may operate in a first operation mode and a second operation mode in relation to a sensing speed.

The plurality of camera modules 2100a, 2100b, and 2100c may generate an image signal (e.g., generate an image signal of a first frame rate) at a first speed in a first operation mode, encode the image signal at a second speed higher than the first speed (e.g., encoding the image signal of a second frame rate higher than the first frame rate), and may transmit the encoded image signal to the application processor 2200. In this case, the second speed may be 30 times or less of the first speed.

The application processor 2200 may store the received image signal, that is, the encoded image signal in a memory 2230 provided therein or a storage 2400 provided outside the application processor 2200, afterwards, read-out the encoded image signal from the memory 2230 or the storage 2400 and decode the encoded image signal, and may display image data generated based on the decoded image signal. For example, a corresponding sub-processor among the plurality of sub-processors 2212a, 2212b, and 2212c of the image processing apparatus 2210 may perform decoding and also perform image processing on the decoded image signal.

The plurality of camera modules 2100a, 2100b, and 2100c may generate an image signal at the third speed less than the first speed in the second operation mode (e.g., generate an image signal of a third frame rate lower than the first frame rate), and transmit the image signal to the application processor 2200. The image signal provided to the application processor 2200 may be an unencoded signal. The application processor 2200 may perform image processing on the received image signal or store the image signal in the memory 2230 or the storage 2400.

The PMIC 2300 may supply power, e.g., a power supply voltage, to each of the plurality of camera modules 2100a, 2100b, and 2100c. For example, the PMIC 2300, under the control of the application processor 2200, may supply first power to the camera module 2100a through the power signal line PSLa, supply second power to the camera module 2100b through the power signal line PSLb, and supply third power to the camera module 2100c through the power signal line PSLc.

The PMIC 2300 may generate power corresponding to each of the plurality of camera modules 2100a, 2100b, and 2100c in response to the power control signal PCON from the application processor 2200, and also adjust the power level. The power control signal PCON may include a power adjusting signal for each operation mode of the plurality of camera modules 2100a, 2100b, and 2100c. For example, the operation mode may include a low power mode, and in this case, the power control signal PCON may include information about a camera module operating in a low power mode and a power level to be set. Levels of powers provided to each of the plurality of camera modules 2100a, 2100b, and 2100c may be the same or different from each other. Also, the level of power may be dynamically changed.

In the above description, the image sensor 2142 provided in at least one of the camera modules 2100a, 2100b, and 2100c may be the image sensor 10 according to an example embodiment described above. The image sensor 2142 provided in some of the camera modules 2100a, 2100b, and 2100c may be provided to sense at least one of visible light and infrared light.

The electronic device 2000 exemplarily shows a configuration using a multi-camera module, and may be modified to another form.

According to the image sensor and its operating method according to an example embodiment, pixel information may be read out in a non-sequential manner in which information of a specific region is read out first, and thus, when only information of a specific region is needed, only information of the specific region may be extracted. Therefore, a memory capacity and a read-out time for processing necessary information are reduced, and post-processing efficiency may be increased. In addition, when a high-resolution image sensor is applied, various resolutions may be applied as needed, and thus, the usability according to the application may be increased.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An image sensor comprising:
   a pixel array including a plurality of pixels;
   a first selection/read-out circuit configured to provide a first signal for selecting a pixel of the pixel array in a first direction and read out a plurality of pixel signals received from the pixel array in the first direction;
   a second selection/read-out circuit configured to provide a second signal for selecting pixels of the pixel array in a second direction and read out a plurality of pixel signals received from the pixel array in the second direction; and
   a controller configured to select the pixel of the pixel array and control the first and second selection/read-out circuits to read out information of the selected pixel,
   wherein the first direction corresponds to one of a row direction or a column direction of the pixel array and the second direction corresponds to other of the row direction or the column direction of the pixel array.

2. The image sensor of claim 1, further comprising:
   a plurality of first selection lines, each configured to provide a selection signal to a respective pixel of the pixel array in the first direction, and a plurality of first transmission lines, each to read out information of a respective pixel in the first direction; and
   a plurality of second selection lines, each configured to provide a selection signal to a respective pixel of the pixel array in the second direction, and a plurality of second transmission lines each configured to read out information of a respective pixel in the second direction.

3. The image sensor of claim 2, wherein the selected pixel is electrically connected to at least one selection line, to which a signal is applied, from among the plurality of first selection lines and at least one selection line, to which a signal is applied, from among the plurality of second selection lines, and one of the first selection/read-out circuit or the second selection/read-out circuit is configured to read-out a pixel signal of the selected pixel.

4. The image sensor of claim 2,
   wherein the first selection/read-out circuit comprises: a first analog-to-digital converter (ADC) circuit configured to convert a pixel signal received through a first transmission line, among the plurality of first transmission lines, into digital data, and
   wherein the second selection/read-out circuit comprises: a second analog-to-digital converter (ADC) circuit configured to convert a pixel signal received through a second transmission line, among the plurality of second transmission lines, into digital data.

5. The image sensor of claim 1, wherein the controller is further configured to control the first selection/read-out circuit and the second selection/read-out circuit to extract pixel information radially from a center of a region of interest of the pixel array.

6. The image sensor of claim 5, wherein the controller is further configured to control the first selection/read-out circuit and the second selection/read-out circuit so that a sequence in which the pixels are extracted is in a spiral form.

7. The image sensor of claim 5, wherein the region of interest corresponds to a range of pixels including or not including a central region of the pixel array.

8. The image sensor of claim 1, wherein the controller is further configured to control the first selection/read-out circuit and the second selection/read-out circuit to vary a resolution of the pixel array.

9. The image sensor of claim 8, wherein the controller is further configured to control the first selection/read-out circuit and the second selection/read-out circuit to extract pixel information from non-contiguous regions of the pixel array.

10. The image sensor of claim 9, wherein the controller is further configured to select the pixel to extract pixel information at a resolution lower than a basic resolution of the pixel array, and read out a pixel signal from the selected pixel.

11. The image sensor of claim 1, wherein the controller is further configured to control the first selection/read-out circuit and the second selection/read-out circuit to extract pixel information from non-contiguous regions of the pixel array.

12. The image sensor of claim 1, wherein the first signal is transmitted to the pixel array in the first direction and the second signal is transmitted to the pixel array in the second direction perpendicular to the first direction.

13. A method of acquiring an image by using an image sensor, the method comprising:
    applying a first signal for selecting a pixel of a pixel array in a first direction through at least one among a plurality of first selection lines; and
    applying a second signal for selecting a pixel of the pixel array in a second direction through at least one among a plurality of second selection lines,
    selecting at least one pixel of the pixel array electrically connected to at least one first selection line applying the first signal and at least one second selection line applying the second signal,
    reading out information of the selected at least one pixel,
    wherein the first direction corresponds to one of a row direction or a column direction of the pixel array and the second direction corresponds to other of the row direction or the column direction of the pixel array.

14. The method of claim 13, wherein the reading out includes reading out information of the selected pixel through at least one of a plurality of first transmission lines that are in the first direction and a plurality of second transmission lines that are in the second direction.

15. The method of claim 14, further comprising converting a pixel signal received through a first transmission line, among the plurality of first transmission lines, into digital data; and converting a pixel signal received through a second transmission line, among the plurality of second transmission lines, into digital data.

16. The method of claim 13, further comprising setting a region of interest of the pixel array, wherein selection signals are applied through the first and second selection lines to radially extract pixel information from a center of the region of interest of the pixel array.

17. The method of claim 16, further comprising applying the selection signals through the first and second selection lines so that a sequence in which the pixels are extracted is in a spiral form.

18. The method of claim 16, wherein the region of interest corresponds to a range of pixels including or not including a central region of the pixel array.

19. The method of claim 16, further comprising applying the selection signals through the first and second selection lines to extract pixel information from a non-contiguous region of the pixel array at a resolution lower than a basic resolution of the pixel array.

20. An electronic device comprising:
- an image sensor configured to receive light reflected from an object, the image sensor comprising:
  - a pixel array including a plurality of pixels;
  - a first selection/read-out circuit configured to provide a signal for selecting a pixel of the pixel array in a first direction and read out a plurality of pixel signals received from the pixel array in the first direction;
  - a second selection/read-out circuit configured to provide a signal for selecting pixels of the pixel array in a second direction and read out a plurality of pixel signals received from the pixel array in the second direction; and
  - a controller provided to select the pixel of the pixel array and control the first selection/read-out circuit and the second selection/read-out circuit to read out information of the selected pixel, wherein the first direction corresponds to one of a row direction or a column direction of the pixel array and the second direction corresponds to other of the row direction or the column direction of the pixel array; and
- a processor configured to process a signal from the image sensor.

* * * * *